(12) United States Patent
Jain

(10) Patent No.: US 9,287,412 B2
(45) Date of Patent: Mar. 15, 2016

(54) QUANTUM DOT CHANNEL (QDC) QUANTUM DOT GATE TRANSISTORS, MEMORIES AND OTHER DEVICES

(76) Inventor: Faquir Chand Jain, Storrs, CT (US)

( * ) Notice: Subject to any disclaimer, the term of this patent is extended or adjusted under 35 U.S.C. 154(b) by 683 days.

(21) Appl. No.: 13/465,872

(22) Filed: May 7, 2012

(65) Prior Publication Data
US 2012/0280208 A1     Nov. 8, 2012

Related U.S. Application Data

(60) Provisional application No. 61/483,553, filed on May 6, 2011.

(51) Int. Cl.
| | | |
|---|---|---|
| H01L 29/78 | (2006.01) | |
| H01L 29/788 | (2006.01) | |
| B82Y 10/00 | (2011.01) | |
| B82Y 40/00 | (2011.01) | |
| H01L 21/28 | (2006.01) | |
| H01L 29/423 | (2006.01) | |
| H01L 29/66 | (2006.01) | |
| H01L 31/028 | (2006.01) | |
| H01L 31/0352 | (2006.01) | |
| H01L 31/078 | (2012.01) | |
| H01L 29/12 | (2006.01) | |
| G11C 16/04 | (2006.01) | |
| B82Y 20/00 | (2011.01) | |
| H01L 29/06 | (2006.01) | |

(52) U.S. Cl.
CPC ............. *H01L 29/7881* (2013.01); *B82Y 10/00* (2013.01); *B82Y 20/00* (2013.01); *B82Y 40/00* (2013.01); *G11C 16/0408* (2013.01); *H01L 21/28273* (2013.01); *H01L 29/125* (2013.01); *H01L 29/42332* (2013.01); *H01L 29/66825* (2013.01); *H01L 31/028* (2013.01); *H01L 31/035218* (2013.01); *H01L 31/035236* (2013.01); *H01L 31/078* (2013.01); *H01L 29/0665* (2013.01); *Y02E 10/547* (2013.01)

(58) Field of Classification Search
CPC ................................................. H01L 31/035218
USPC .......................... 257/402, 405, 406, 410, 411
See application file for complete search history.

(56) References Cited

U.S. PATENT DOCUMENTS

| | | | | |
|---|---|---|---|---|
| 2006/0220001 A1* | 10/2006 | Uetake et al. | .......... | B82Y 10/00 257/14 |
| 2009/0127542 A1* | 5/2009 | Sugaya et al. | .......... | B82Y 10/00 257/24 |
| 2009/0173934 A1* | 7/2009 | Jain | ........................ | G11C 11/56 257/20 |
| 2013/0049738 A1* | 2/2013 | Sargent | ............... | H01L 31/1129 324/96 |
| 2013/0146838 A1* | 6/2013 | Ku et al. | ......... | H01L 31/035218 257/13 |
| 2015/0053930 A1* | 2/2015 | Zhang | ............... | H01L 21/02521 257/29 |

* cited by examiner

*Primary Examiner* — George Fourson, III
(74) *Attorney, Agent, or Firm* — Steven M. McHugh

(57) ABSTRACT

This invention describes a field-effect transistor in which the channel is formed in an array of quantum dots. In one embodiment the quantum dots are cladded with a thin layer serving as an energy barrier. The quantum dot channel (QDC) may consist of one or more layers of cladded dots. These dots are realized on a single or polycrystalline substrate. When QDC FETs are realized on polycrystalline or nanocrystalline thin films they may yield higher mobility than in conventional nano- or microcrystalline thin films. These FETs can be used as thin film transistors (TFTs) in a variety of applications. In another embodiment QDC-FETs are combined with: (a) coupled quantum well SWS channels, (b) quantum dot gate 3-state like FETs, and (c) quantum dot gate nonvolatile memories.

6 Claims, 39 Drawing Sheets

US 9,287,412 B2

QUANTUM DOT CHANNEL (QDC) QUANTUM DOT GATE TRANSISTORS, MEMORIES AND OTHER DEVICES

CROSS REFERENCE TO RELATED APPLICATIONS

This application claims priority to and benefit of the filing date of U.S. Provisional Patent Application No. 61/483,553, filed May 6, 2011, the contents of which are incorporated herein by reference in its entirety.

STATEMENT REGARDING FEDERALLY SPONSORED RESEARCH

The United States Government has certain rights in this invention pursuant to National Science Foundation Grant No. ECS 0622068.

FIELD OF THE INVENTION

The present invention applies to field-effect transistors (FETs) and more particularly to FETs using quantum dot channels, nonvolatile random access memories (RAMs) with addressable quantum dot floating gates and ultrahigh value capacitors for energy storage as well as a method of fabricating heteroepitaxial structures which are mediated by quantum dot layers to reduce defects.

BACKGROUND OF THE INVENTION

In the past few years, researchers have investigated various approaches to fabricating FETs which range from using carbon nanotube to using graphene devices, nanowire Si and SiGe FETs, and Ge and InGaAs FETs. Unfortunately however, current FETs have only one inversion layer which is formed in the proximity of the gate insulator. Accordingly, this limits the current FETs to only exhibit two states: ON and OFF. Thus, the applications for current transistors are limited in that designs must take into account the bi-state functionality of the FETs. Accordingly, functionality of current FETs are limited.

One such example is seen in FIG. 1a which illustrates a single channel FET in accordance with the prior art. Another such example is seen in FIG. 1b which illustrates a floating gate memory cell having an asymmetric source/drain, with the drain side of p-type halo or pocket doping in accordance with the prior art. Still yet another example is shown in FIG. 1c which illustrates a NOR array architecture of a floating gate memory cell and which shows erasing in accordance with the prior art. Still yet another example is shown in FIG. 1d which illustrates a NAND array architecture of a floating gate memory cell in accordance with the prior art. Furthermore, other examples are shown in FIG. 2a which illustrates a quantum dot gate 3-state FET and FIG. 2b which illustrates a conventional nanocrystal quantum dot floating gate memory both in accordance with the prior art. It should be appreciated that although the quantum dot gate FET of FIG. 2a does exhibit 3-states, the intermediate state (i.e. the third state) is a low-current state near the threshold region, which is undesirable.

SUMMARY OF THE INVENTION

A quantum dot channel (QDC) field-effect transistor device is provided and includes a substrate, wherein the substrate includes a source region, a gate region, a drain region, and a transport channel located between the source region and the drain region, wherein the transport channel is comprised of an array of cladded quantum dots, the cladded quantum dots being comprised of at least one Si and Ge and having a thin cladding layer comprised of at least one of SiOx and GeOx, and wherein the array of cladded quantum dots include a top layer of cladded quantum dots and a bottom layer of cladded quantum dots, the array of cladded quantum dots being assembled on a semiconductor substrate of p-type conductivity and being constructed from a semiconductor material which includes at least one of Si, Ge, InGaAs, GaAs, GaN, wherein the array of cladded quantum dots are deposited in a region between source region and the drain region, and wherein the cladding of the top layer of cladded quantum dots is deposited with a thin gate insulator layer, wherein the thin gate insulator layer is deposited with a gate material constructed from at least one of a metallic material and a semiconducting material which results in a pre-determined threshold voltage for the field-effect transistor.

A field effect transistor is provided, wherein the FET is configured as a nonvolatile random access memory. The FET includes a source region, a gate region, a drain region, and a transport channel region located between the source region and the drain region, wherein the gate region includes a first thin gate insulator layer deposited with a first set of cladded quantum dots over the transport channel region, and wherein the first set of cladded quantum dots is deposited with a second set of cladded quantum dots having a thin cladding layer, the first set of cladded quantum dots forming a floating gate which stores a charge when a memory is written, and wherein the second set of cladded quantum dots include a thin barrier and a small core to transport charge, wherein a top part of the second set of cladded quantum dots is deposited with a second gate insulator over the transport channel region, wherein a first gate is formed over the first set of cladded quantum dots and the second set of cladded quantum dots, wherein the first gate is disposed over the transport channel region, and wherein the second set of cladded quantum dots are contacted by a second gate which is located differently from the first gate, wherein the second gate is formed in a region where the gate insulator is relatively thicker then the first gate insulator, and wherein the second gate is used to extract electrons deposited on the quantum dot floating gate during an erase cycle, wherein the electrons may be removed by biasing the second gate and the source region.

A p-n junction diode is provided and includes at least one layer of quantum dot superlattice, wherein the quantum dot superlattice includes two or more layers of cladded quantum dots, wherein the cladding is thin and is comprised of higher energy gap oxide than the gap of the quantum dot, wherein the other layer forming the diode is of opposite conductivity than that of the quantum dot superlattice.

BRIEF DESCRIPTION OF THE FIGURES

The foregoing and other features and advantages of the present invention should be more fully understood from the accompanying detailed description of illustrative embodiments taken in conjunction with the following Figures in which like elements are numbered alike in the several Figures:

FIG. 4c is a graph showing the Id-Vd characteristics of the fabricated Ge QDC-FET of FIG. 4a.

FIG. 10b is a schematic block diagram showing the cross-section $X_1$-$X_2$ of the nonvolatile random access memory of FIG. 10a.

FIG. 10c is a schematic block diagram showing the cross-section $Y_1$-$Y_2$ of the nonvolatile random access memory of FIG. 10a.

DETAILED DESCRIPTION OF THE INVENTION

Figure 1A:
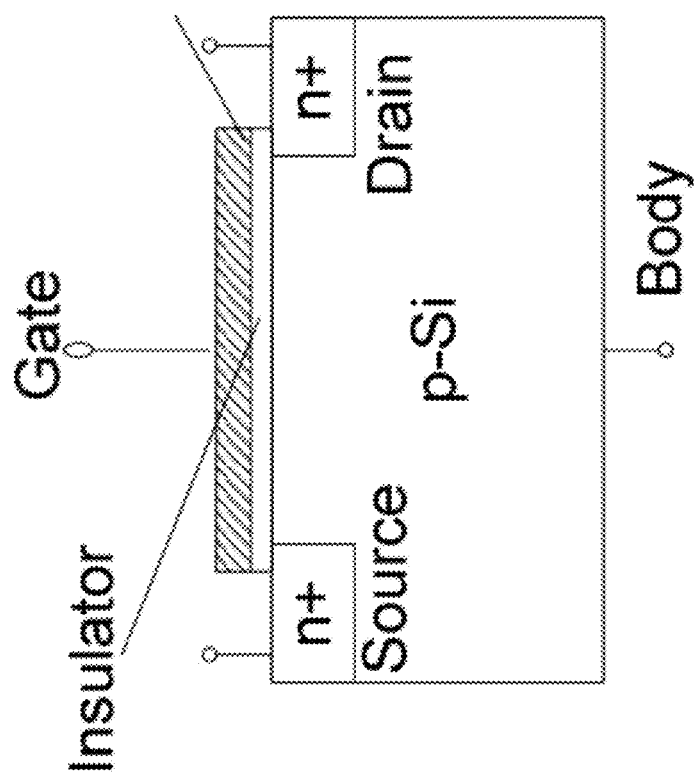
FIG. 1a is a schematic block diagram showing a single channel Field Effect Transistor (FET), in accordance with the prior art.

In accordance with the invention, a field-effect transistor in which a channel is formed in an array of quantum dots is provided and described herein. In one embodiment the quantum dots are cladded with a thin layer serving as an energy barrier. The array of quantum dots with a thin barrier (about 1-2 nm) form a superlattice like layer in two or three dimensions. The quantum dot channel (QDC) may consist of one or more layers of cladded quantum dots. These quantum dots may be realized on a single or polycrystalline substrate. It should be appreciated that when QDC FETs are realized on polycrystalline or nanocrystalline thin films, they may yield higher mobility than in conventional nano- or microcrystalline thin films. These FETs can advantageously be used as thin film transistors (TFTs) in a variety of applications. In another embodiment QDC-FETs are combined with: (a) coupled quantum well Spatial Wavefunction Switched (SWS) channels and (b) quantum dot layers like used in 3-state FETs. In another embodiment, a QDC is combined with a floating gate layer in nonvolatile memories to achieve faster erasing and individual memory cell addressing like a nonvolatile random access memory. It should be appreciated that an array of quantum dots forming a quantum dot channel (QDC) is referred to as a Quantum dot superlattice (QDSL) layer that can be used to form n-region of a p-n diode, bipolar transistors (n-p-n or p-n-p), and/or a p-n solar cell.

In another embodiment, the quantum dots, forming the floating gate of a nonvolatile memory device, may be accessed to remove charge from the floating gate to accomplish a faster erase operation. Such a device is also presented.

In still yet another embodiment, stacks of quantum dots are formed to realize a high value ultra large capacitor. This utilizes the high dielectric constant of cladded quantum dots such as SiOx-cladded Si dots and GeOx-cladded Ge dots with a higher effective dielectric constant than SiOx or GeOx.

In still yet another embodiment, a layer of quantum dots may be used to serve as a mediator layer, thereby reducing dislocations to achieve growth of mismatched epitaxial layer on a substrate.

This application builds on U.S. patent application Ser. No. 12/006,974 for nonvolatile floating quantum dot gate and three-state devices, the contents of which are incorporated herein by reference in its entirety. It should be appreciated that double quantum dot structures, which are laterally coupled by Coulomb blockade barriers and that involve spin-based quantum computing, have been recently reported by a number of investigators. By contrast, quantum dot gate FETs exhibit three-state behavior and multiple states are reported for single electron transistors, SETs.

In accordance with the present invention, Quantum Dot Channel (QDC) FET structures where the transport channel is comprised of an array of quantum dots (with 3-4 nm core cladded with thin barriers) where current transport is quantized is provided and disclosed herein. These devices exhibit step-like drain current-gate voltage (ID-VG) characteristics which are generally expected in single electron transistors (SETs). QDC-FETs involve more than a few electrons and advantageously operate at room temperature. Moreover, Quantum Dot Channels can advantageously be combined with spatial wave-function-switched (SWS) Field-Effect Transistors to process two or more bits simultaneously.

Figure 3A:
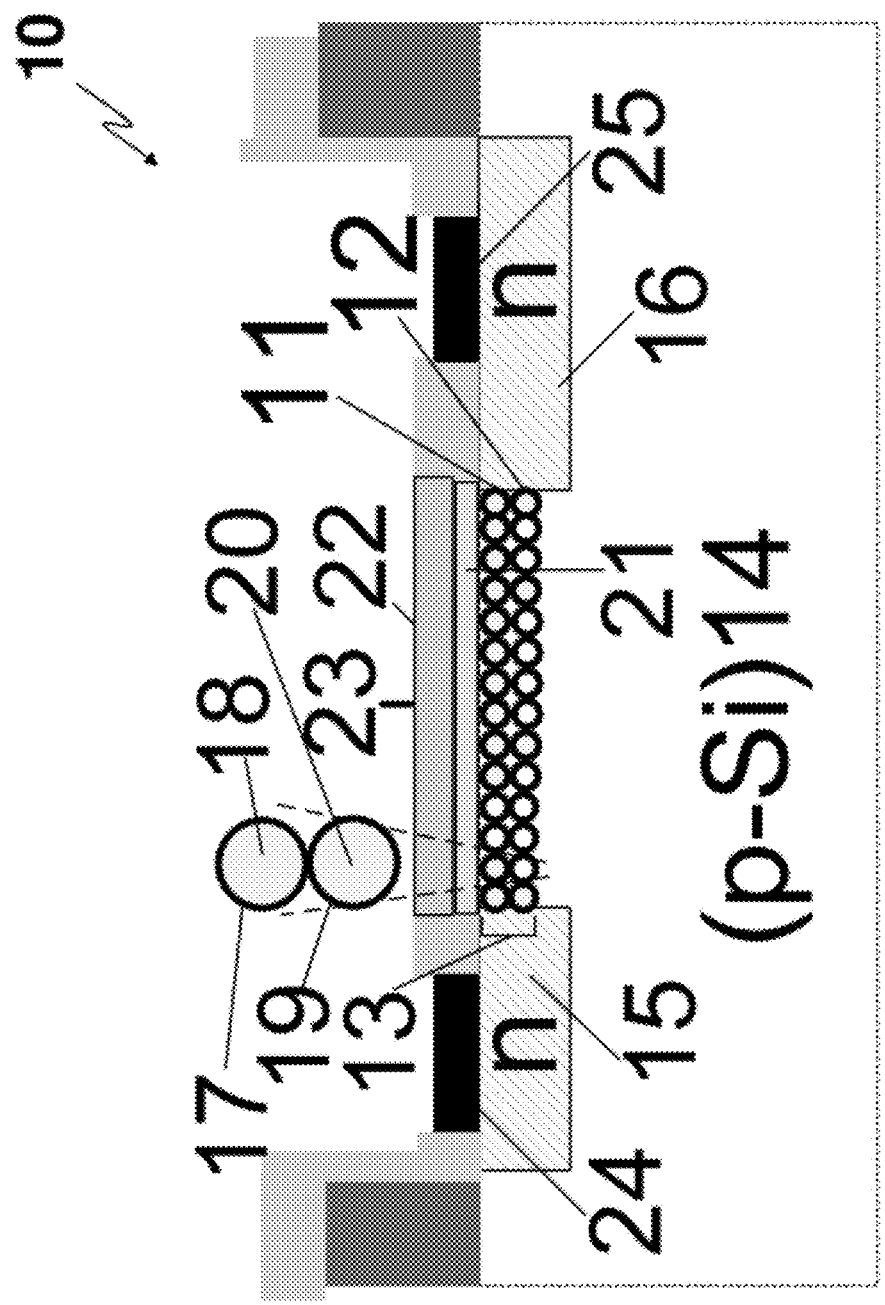
FIG. 3a is a schematic block diagram of a $SiO_x$-cladded Si Quantum Dot Channel (QDC) Si FET, in accordance with one embodiment of the present invention.

FIG. 3a shows the structure of a quantum dot channel QDC-FET 10, in accordance with one embodiment of the present invention. Two layers 11 and 12 of $SiO_x$-cladded Si dots are site-specifically self-assembled to form a transport channel 13 serving as an n-channel on a p-Si region 14 between the source region 15 and the drain 16 region. The top quantum dot layer 11 may have a thin $SiO_x$ cladding 17 on the Si quantum dots 18 (shown in exploded view). Quantum dots 20 and the cladding 19 on the quantum dots 20 forming the bottom quantum dot layer in the channel is also shown. The exploded view inset shows the details of cladding and dot regions. The top quantum dot layer 11 is deposited with a thin gate insulator layer 21 which material may be selected from one or more of $HfO_2$, SiON, $Al_2O_3$ and/or any other suitable gate insulator film materials or combination of materials. The gate insulator layer 21 is deposited with a gate material 22 which is selected from one or more of Al, TaN, TiN, p- or n-type poly Si, other semiconductor materials and/or combination of semiconductor materials, and/or low and high work function metals. The source region 15 and drain region 16 have contacts 24 and 25, respectively. Additionally, the gate material 22 has an interconnect 23. It should be appreciated that interconnects for the source contact and drain contact is not shown.

Figure 3B:
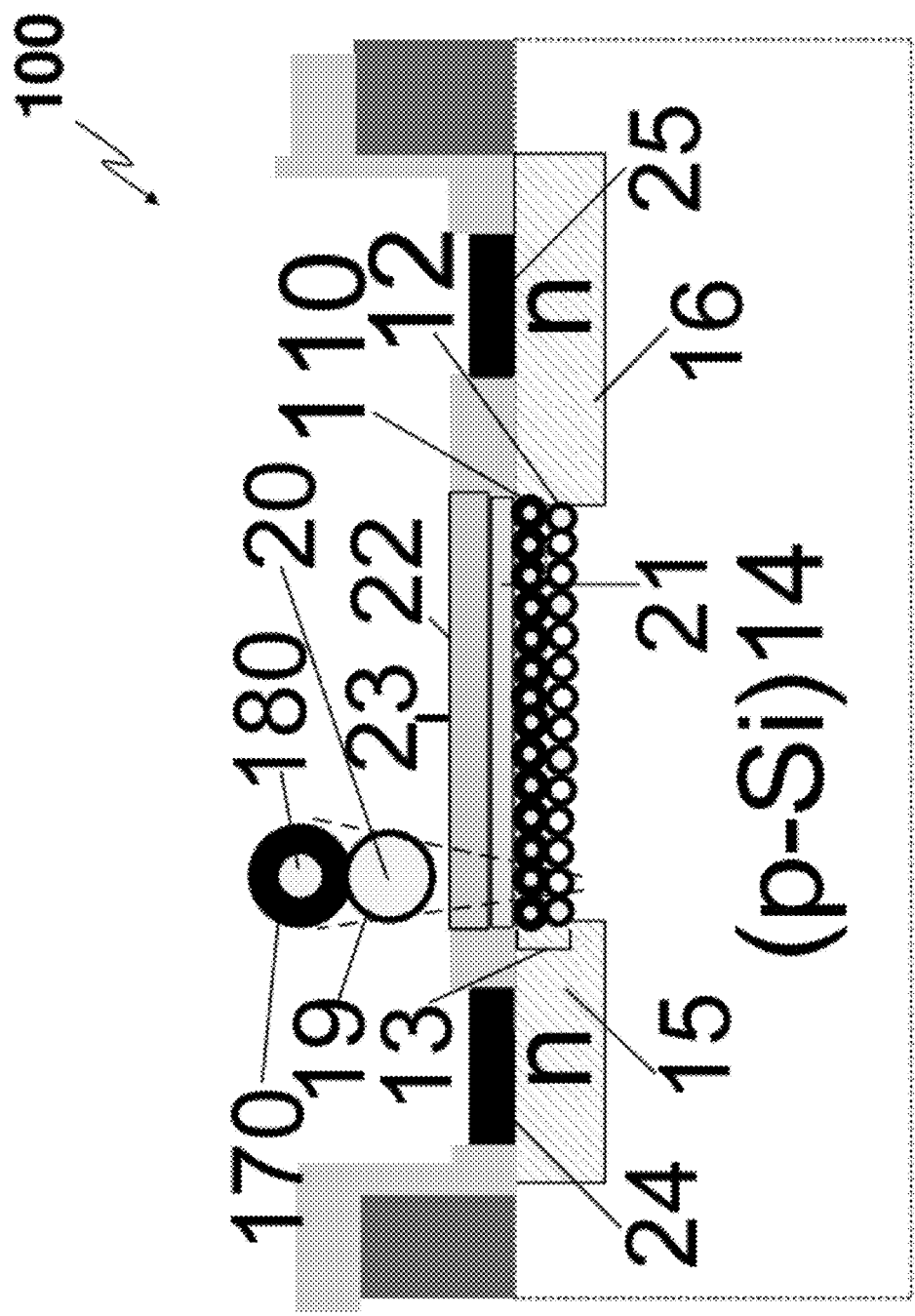
FIG. 3b is a schematic block diagram of a QDC-FET having two asymmetric layers of cladded quantum dots (wherein the top layer has thicker cladding), in accordance with another embodiment of the present invention.

FIG. 3b shows another embodiment of the present invention, wherein in the structure of a quantum dot channel QDC-FET 100 the top cladded dot layer 110 has a thicker $SiO_x$ cladding layer 170 on the Si dot 180 then in the bottom layer 12 (shown in the exploded view). In this embodiment, the top cladded quantum dot layer 110 has quantum dots with smaller diameters and thicker cladding 170 than the quantum dots in the bottom cladded quantum dot layer 12. The top cladded dot layer 170 in conjunction with gate insulator layer 21 serve as the effective gate insulator film. In still yet another embodiment, there may be no separate gate insulator layer 21, where the cladding 170 may serve as the gate dielectric over which the gate metal layer 22 may be deposited.

Figure 3C:
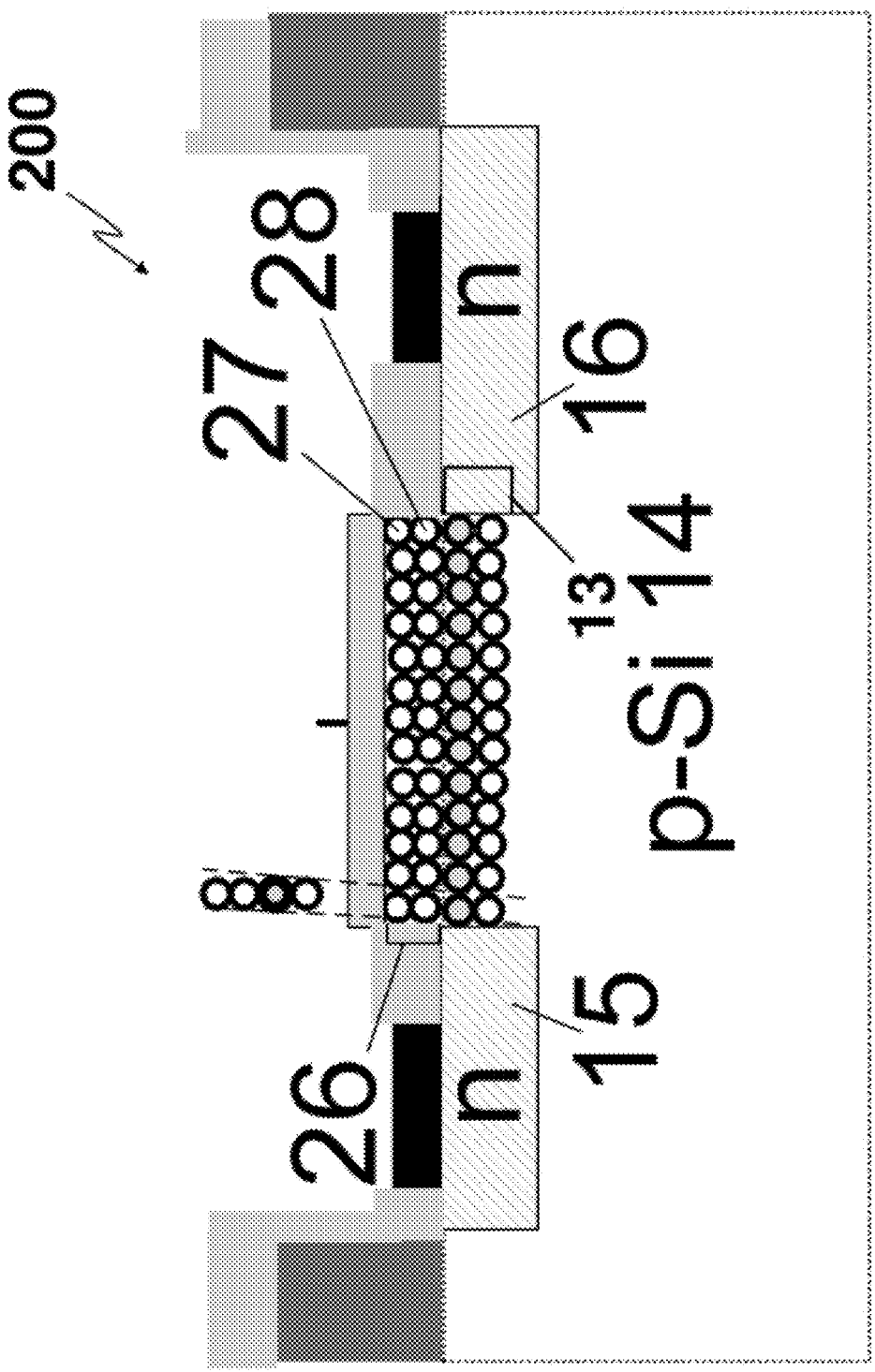
FIG. 3c is a schematic block diagram of a QDC-FET having a quantum dot gate, in accordance with still yet another embodiment of the present invention.

FIG. 3c shows still yet another embodiment of a QDC FET structure 200 which includes an additional set of quantum dot layers 26 which may include two (or more) cladded quantum dot layers 27 (top) and 28 (bottom) comprised of cladded Si quantum dots that form the quantum dot gate, over the first set of quantum dot layers 13 (110 and 12) forming the quantum dot channel shown in FIG. 3b. In the structure of FIG. 3c, the difference is in the construction of the transport channel which is comprised of quantum dots.

Figure 3D:
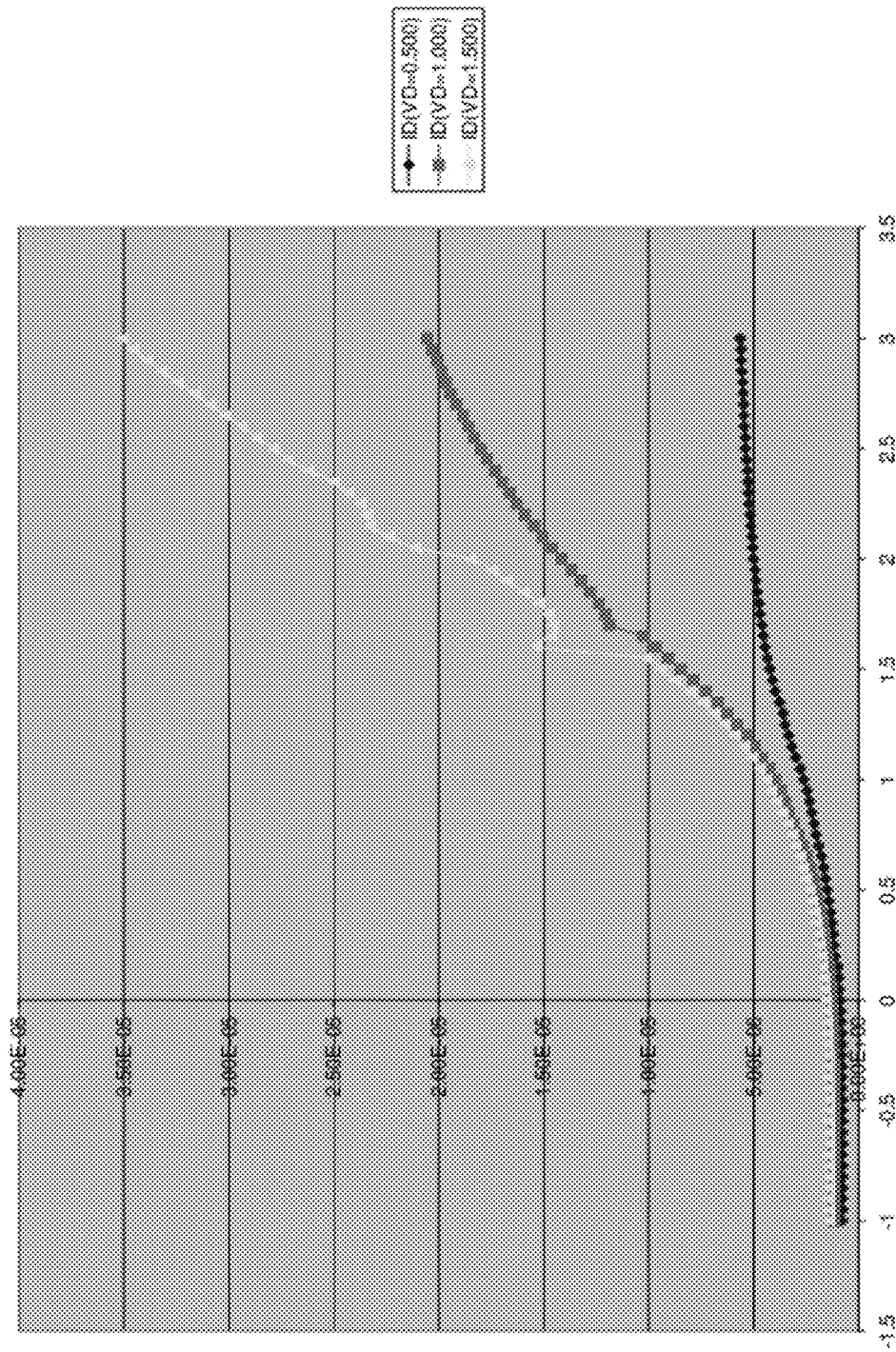
FIG. 3d is a graph showing the drain current (ID)-gate voltage (VG) characteristics of the quantum dot gate QDC-FET of FIGS. 3a, 3b and 3c.

For example, generally in conventional FETs, the carrier transport channel (also known as the inversion layer) is formed on the Si surface that interfacaes with the gate insulator ($SiO2$ or $HfO2$ etc). Using arrays of quantum dots as a conducting quantum dot channel (QDC) between the source and gate region of a FET under the gate (the QDC-FET) results in more than a 2-state FET device. The QDC transport channel has mini energy bands due to the formation of QDSL. The number of carriers in the QDSL or QDC is determined by the gate voltage (when it is above threshold) and the drain voltage (with respect to source) determines how many mini-energy bands are participating in current conduction. This gives rise to multi-state behavior as shown in FIG. 3d.

Figure 3E:
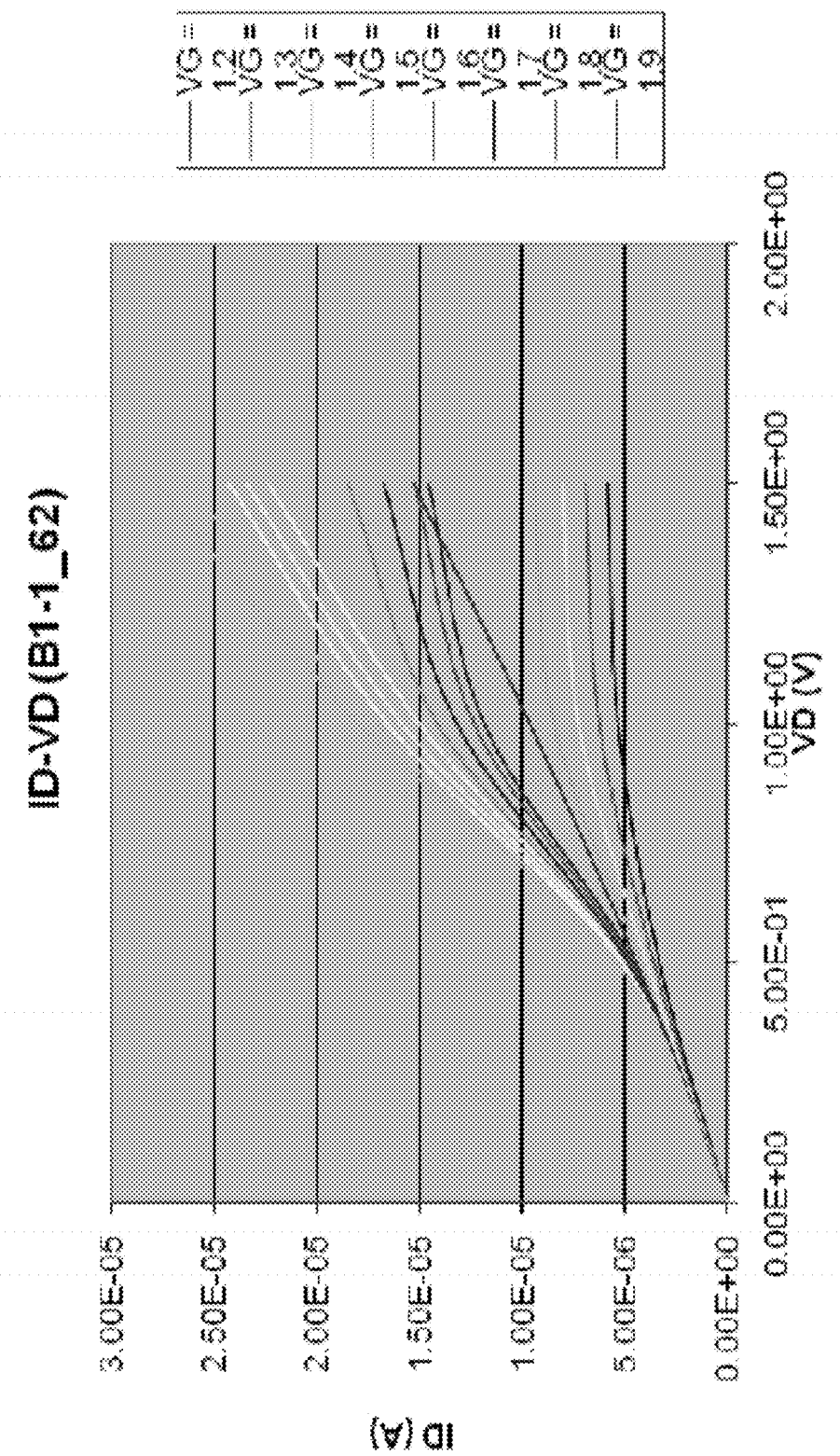
FIG. 3e shows is graph showing the drain current (Id)-drain voltage (Vd) characteristics at various gate voltages for the quantum dot gate QDC-FET of FIGS. 3a, 3b and 3c.

In accordance with the invention, there are distinct regimes of operation of the QDC-FET depending on the gate voltage and drain voltage. In conventional FETs, there are only two states in the ID-VG plot. This is in contrast to the present invention (See FIG. 3d) which has an OFF state below the threshold voltage (Vth equal to about 0.3 V), another state when the first jump appears at about 1.5V (between about 0.3 to about 1.5V), still yet another state at about 2V (that is, between about 1.5V and about 2V), and still yet another state above 2V. Depending on the superlattice minibands and their separation, even more states are possible. FIG. 3d and FIG. 3e illustrate an example of the transfer characteristics (drain current ID-gate voltage VG) and output characteristics (ID-VD), respectively, for the structure of FIG. 3c. As can be seen from FIG. 3d, the transfer characteristics show quantized "intermediate states" as the drain voltage is increased for a given gate voltage. FIG. 3d shows the drain current-drain voltage characteristics as a function of gate voltage, showing clearly three different regimes in which the FET is operated. The QDC channel characteristics, when combined with a multi-state spatial wavefunction-switched (SWS) structure (comprised of coupled quantum well layers), are further modified in terms of number of intermediate states (that would further enhance the number of bits that can be processed in such a device). Thus, QDC-FETs could function in a manner similar to single electron transistors.

Figure 4A:
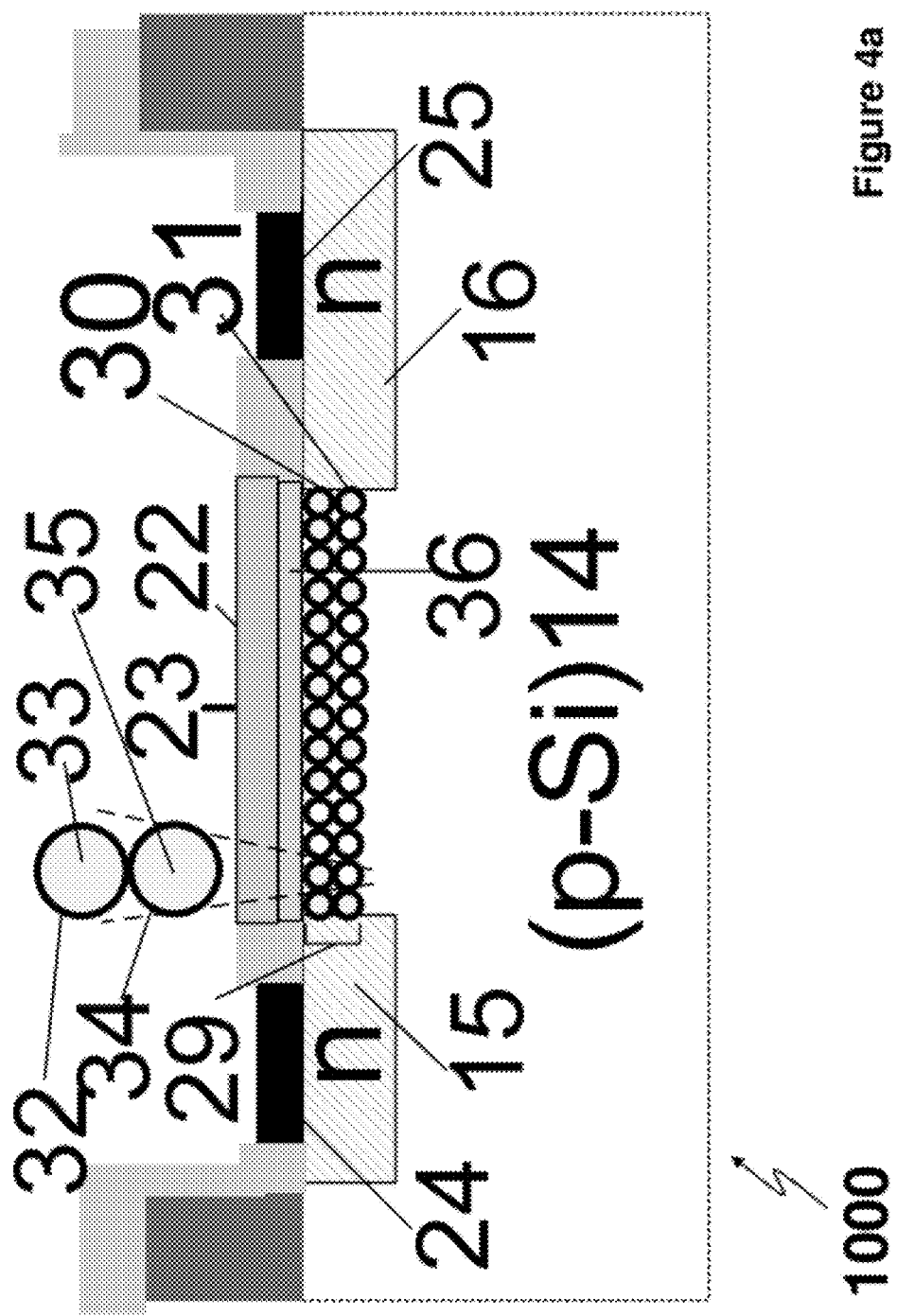
FIG. 4a is a schematic block diagram of a QDC-FET incorporating $GeO_x$-cladded Ge layers to form the quantum dot channel, in accordance with the present invention.
Figure 4B:
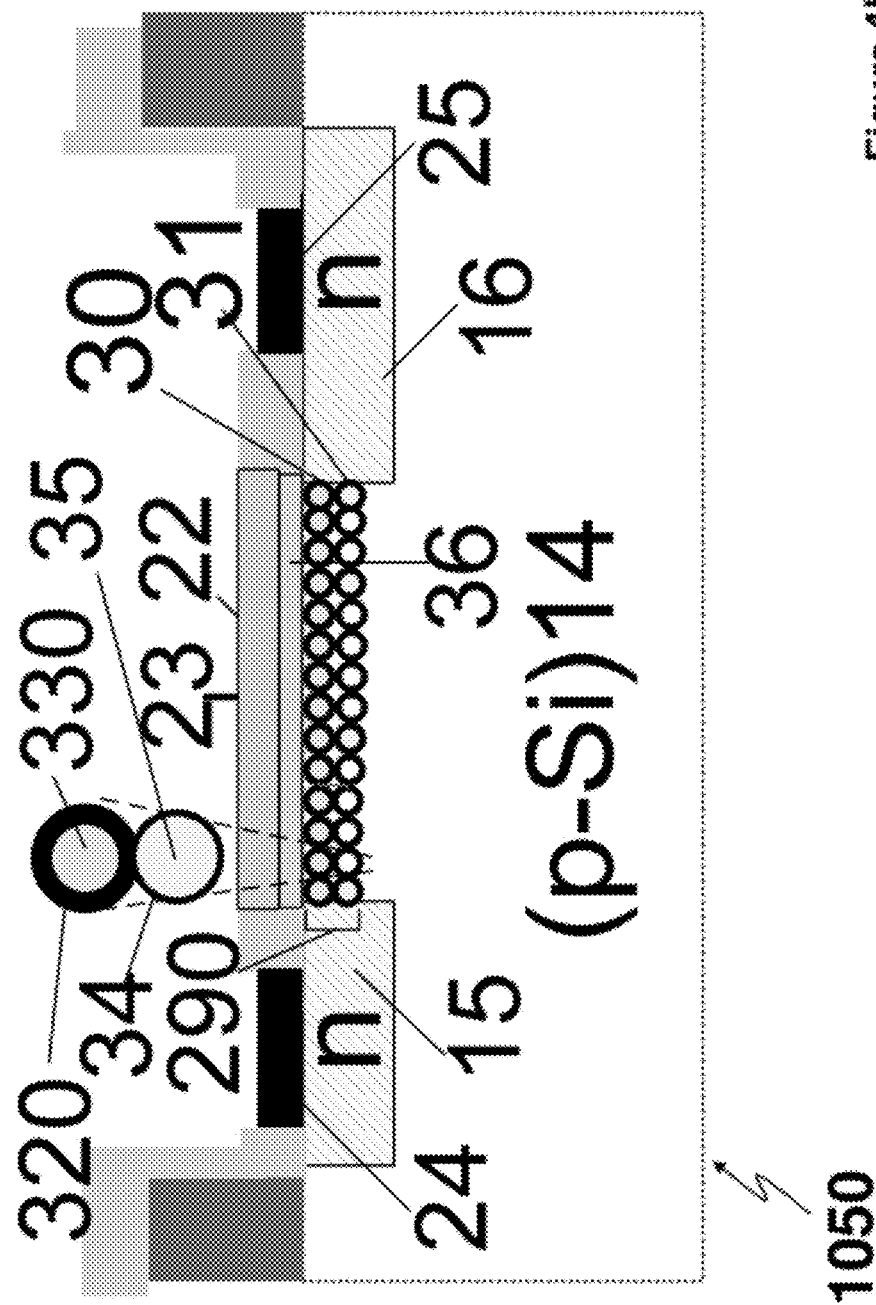
FIG. 4b is a schematic block diagram of a QDC-FET having two asymmetric GeOx-cladded Ge dot layers (wherein the top layer has thicker cladding), in accordance with the present invention.

Referring to FIG. 4a, a QDC-FET 1000 incorporating GeO$_x$-cladded Ge layers which form the quantum dot channel 29 is shown. In this case, two layers 30, 31 of GeO$_x$-cladded Ge quantum dots are site-specifically self-assembled to form a transport channel 29 which serves as an n-channel on a p-Si region 14 between the source region 15 and the drain region 16. The top quantum dot layer 30 has a thin GeO$_x$ cladding 32 on Ge quantum dots 33. The cladding 34 and quantum dot 35 forming the bottom quantum dot layer 31 in the channel 29 is also shown. The exploded inset view shows the details of the cladding and dot regions. The top quantum dot layer 30 is deposited with a thin gate insulator layer 36 which may be constructed from HfO$_2$, SiON, Al$_2$O$_3$, any combination thereof and/or any other suitable gate insulator film material or combination of materials. FIG. 4b shows another embodiment of a GeO$_x$—Ge QDC-FET 1050. Here, the two layers of quantum dots 30, 31 forming the channel 290 are asymmetric in construction, wherein the quantum dots in the upper quantum dot layer 30 has a thicker cladding 320 and smaller core diameter 330 than the quantum dots in the bottom quantum dot layer 31 whose dot cladding is 34 and dot diameter is shown as 35. It should be appreciated that quantum dots are typically between about 2 nm to about 5 nm and cladding is typically about 1 nm to about 2 nm. Moreover, quantum dots could be thicker (about 6 nm to about 9 nm) but the cladding typically remains around about 1 nm to 2 nm. (these sizes could be more or less than the above ranges as desired).

Figure 4C:
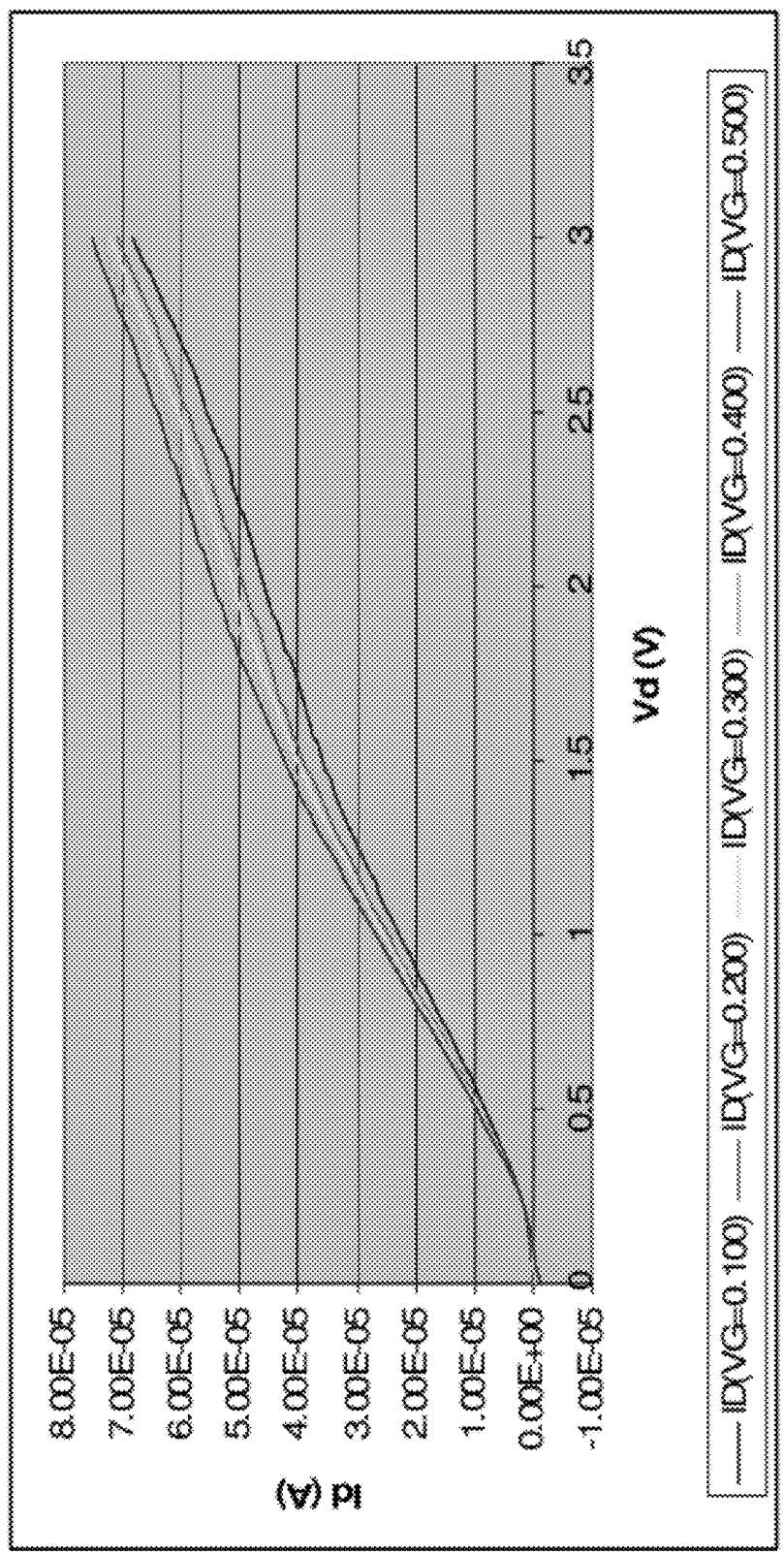

FIG. 4c shows the drain current (Id)-drain voltage (Vd) characteristics as a function of the gate voltage where HfO$_2$ is used as a gate insulator 36 for the QDC-FET 1000 of FIG. 4a. It should be appreciated that the QDC-FET is a generic FET device as is evident from FIGS. 4a-4c where GeO$_x$-cladded-Ge quantum dots have been used to form the channel on Si substrates. Similarly, these dots can be formed to realize QDC-FET on other semiconductor thin films and substrates as desired. It should be appreciated that Ge quantum dots have an advantage of higher mobility channel than Si.

Figure 5A:
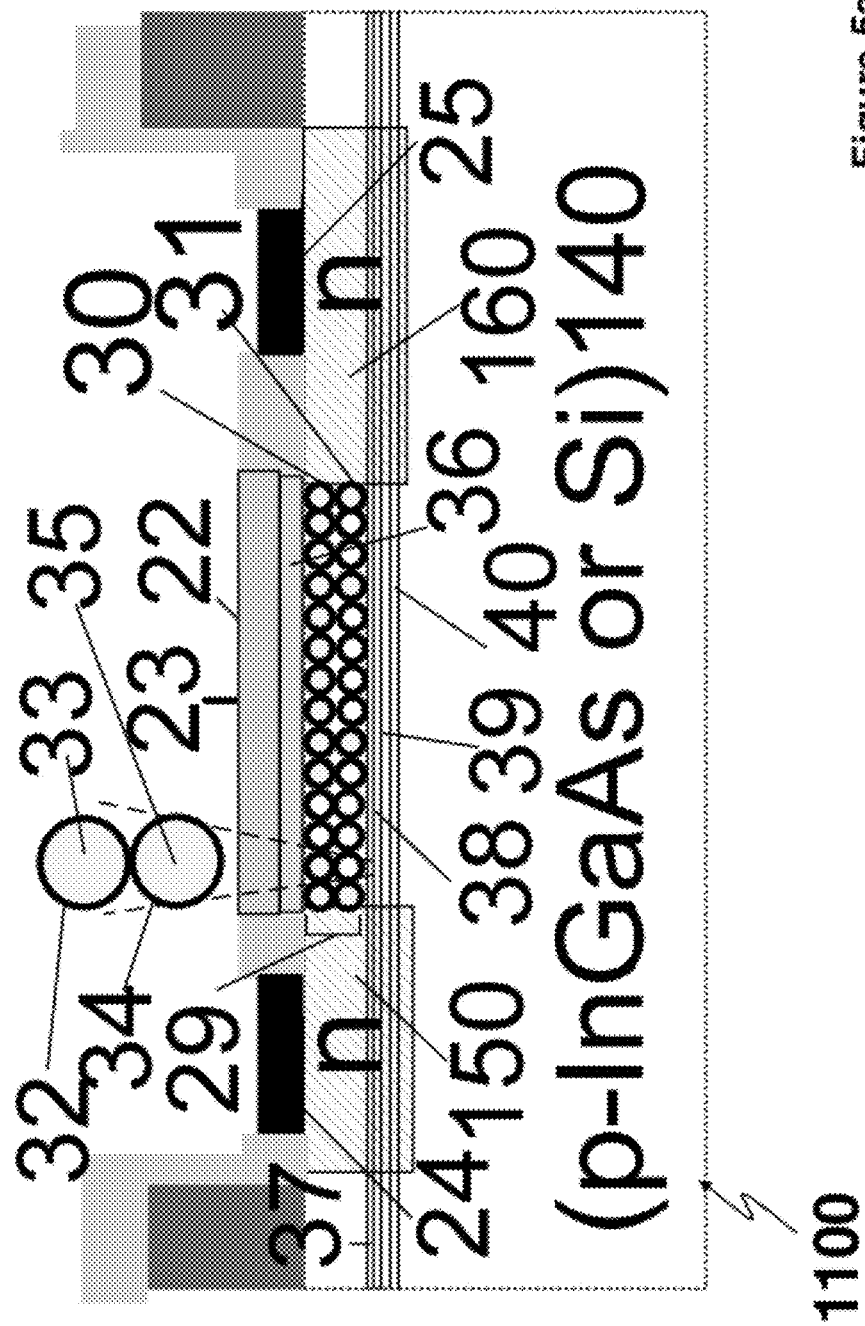
FIG. 5a is a schematic block diagram of a QDC-FET incorporating two quantum well layers as used in spatial wavefunction-switching (SWS) transistors as well as a quantum dot gate layer forming the floating gate, in accordance with the present invention.

Referring to FIG. 5a, a QDC-FET 1100 which incorporates two quantum well layers 37, 39 as used in spatial wavefunction-switching (SWS) transistors as well as a quantum dot gate layer to form the floating gate is provided, in accordance with another embodiment of the present invention. As shown, the QDC-FET 1100 incorporates two quantum well layers 37 and 39 (sandwiched between two barrier layers 38 and 40) grown on a substrate 140, such that the quantum dot channel 29 (comprised of two (could be one or more) quantum dot layers 30 and 31) is realized on the coupled quantum well structure. This quantum well channel and quantum well spatial wavefunction-switching (SWS) structure (comprised of quantum wells and barriers) are contacted by a source 150 and a drain 160. Depending on the material systems used, these regions may be implemented using selective etching and n+ regrowth of layers that provide electrical contacts to the quantum wells as well as the quantum dot channel 29. It should be appreciated that generally the cladded quantum dot layers and asymmetric coupled quantum well layers operate in cooperation. For example, first the inversion electrons appear in the coupled quantum well structure as the gate voltage approaches a threshold voltage. An additional increase in the gate voltage moves the electron charge to the upper quantum well and subsequently to the quantum dot channel 29. It should be appreciated that as used herein asymmetry may apply to different thicknesses and/or different material compositions.

Figure 5B:
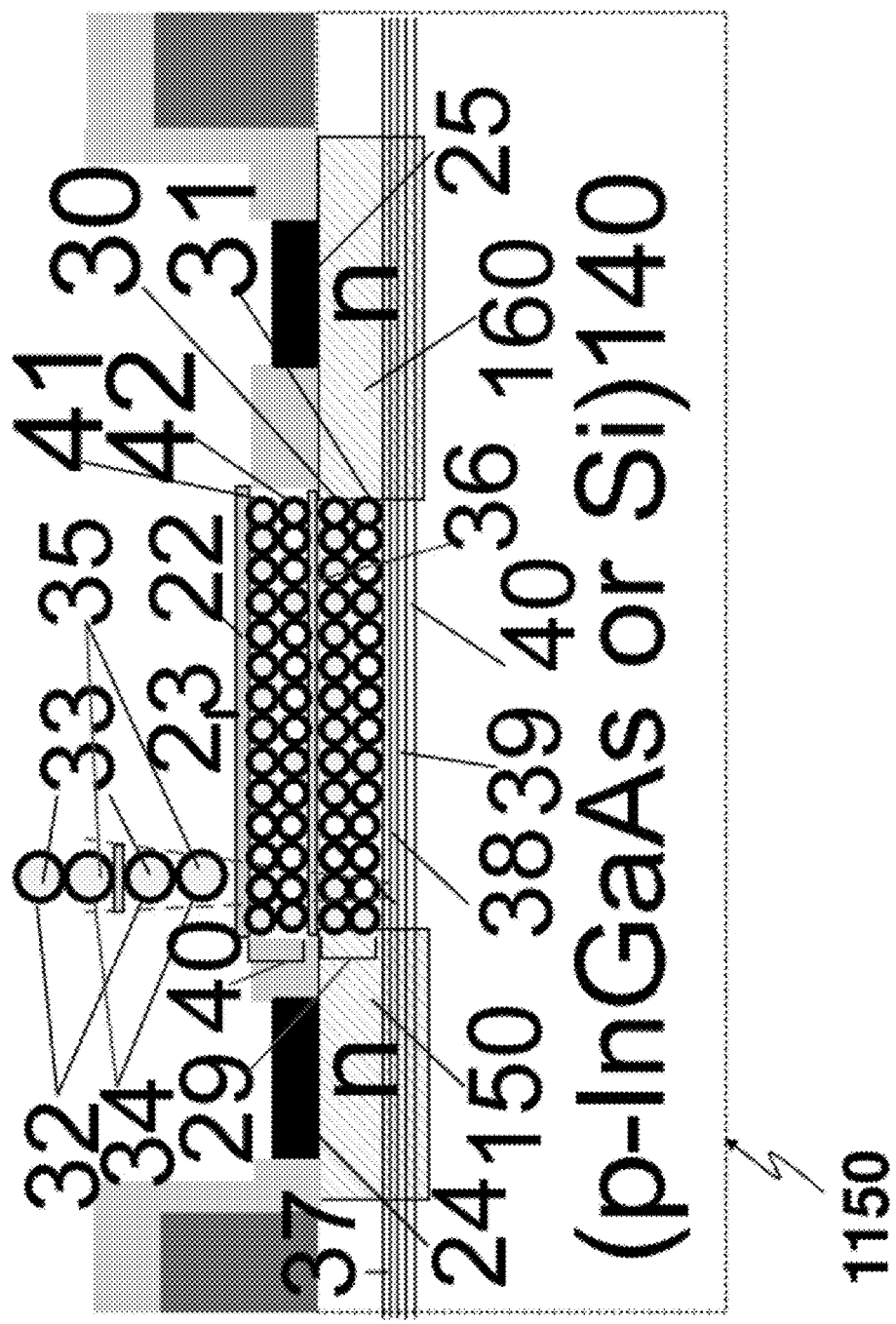
FIG. 5b is a schematic block diagram of a QDC-SWS and QDG FET, in accordance with the present invention.

FIG. 5b shows a QDC-FET 1150 in accordance with another embodiment of the invention, where in addition to the SWS structure a quantum dot gate structure is also incorporated in the gate region. As shown, a quantum dot gate layer 40 is located above the gate insulator layer 36 and is comprised of a cladded quantum dot top layer 41 and a cladded quantum dot bottom layer 42. It should be appreciated that the construction of the cladded quantum dot layers 41, 42 may be similar or different in terms of their cladding and dot materials as well as their thickness. FIG. 5b shows similar quantum dots 41, 42 as that used to form the quantum dot channel 29, where the claddings 32 and 34 and quantum dots 33 and 35 are similar. It should be further appreciated that the top quantum dot layer 41 may be deposited with a gate material 22 and its electrical contact 23 is shown like other figures. It should be further appreciated that the gate material may be selected from a metal (such as TiN, TaN or other suitable material) or it could be a semiconductor material. Its work function (relative to the channel layer work function) determines the flat band voltage and the threshold voltage.

Figure 5C:
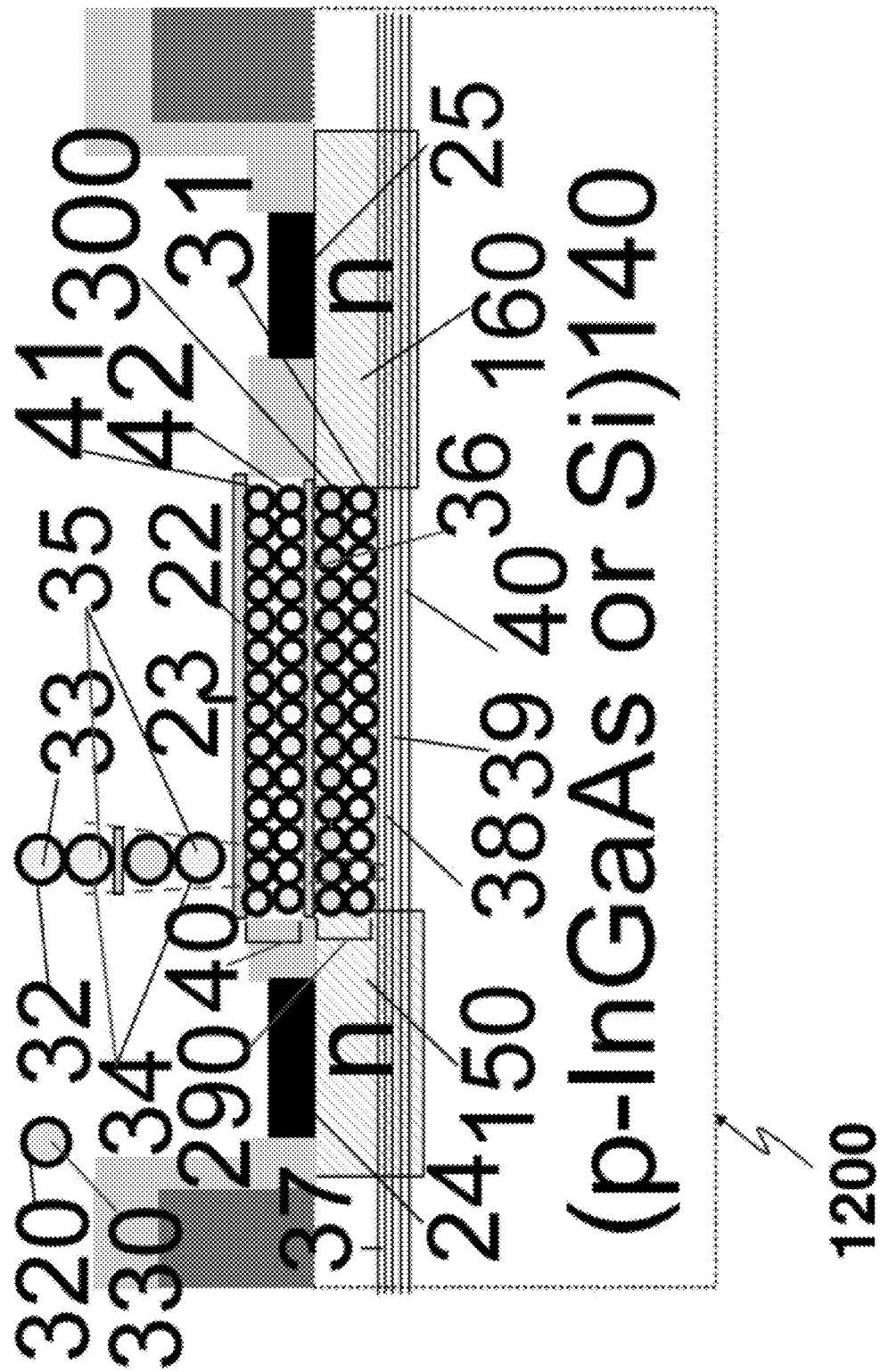
FIG. 5c is a schematic block diagram of a QDC-SWS and QDG FET having asymmetric quantum dot layers, in accordance with the present invention.

FIG. 5c shows a QDG QDC-SWS FET device 1200 in accordance with another embodiment of the invention. In this case, the quantum dot layers forming the quantum dot channel 290 utilize asymmetric quantum dots in their quantum dot bottom layer 31 and quantum dot top layer 300. The top quantum dot core is shown as 330 and its cladding is shown as 320. It should be appreciated that the dot layers are of different dot diameter and cladding thickness. Of the QDC channel 290, the top cladded QD layer 300 has a different cladding thickness and dot diameter than in QD layer 31. The rest of the structure is similar to that of FIG. 5b.

Figure 6:
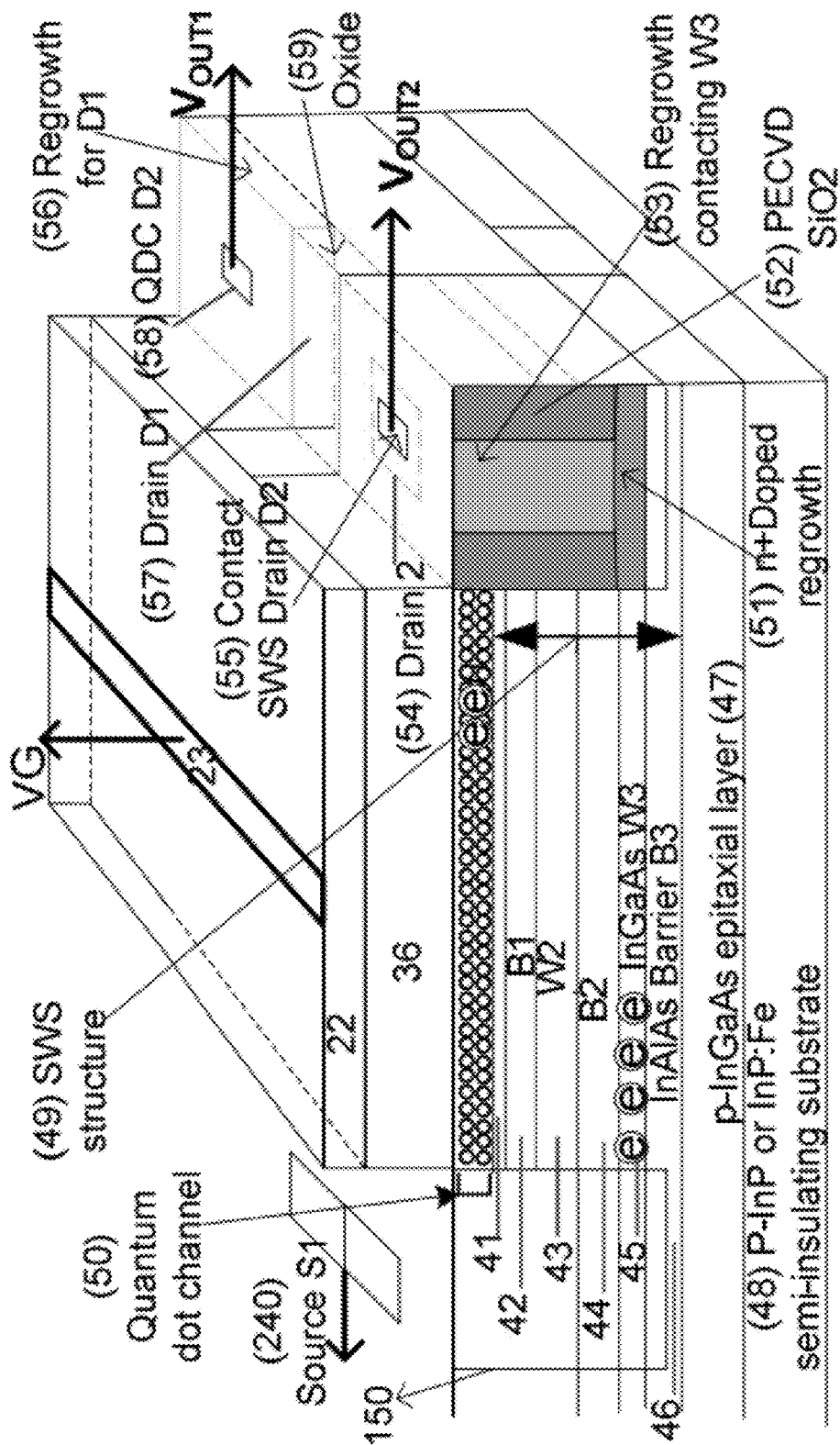
FIG. 6 is a 3-D schematic block diagram of a QDC channel combined with 3-InGaAs quantum well SWS structure, in accordance with the present invention.

FIG. 6 shows a 3-D view of a device having a QDC channel combined with 3-quantum well SWS structures that use InGaAs wells. In this case, well W1 41 is sandwiched between QDC layer 50 and barrier B1 42, well W2 43 is between two barrier layers 42 and 44, and well W3 45 is sandwiched between barrier 44 and barrier B3 46. The SWS structure 49 is grown on a p-InGaAs epitaxial layer 47 which is grown on a substrate 48 (comprised of p-InP, Fe-doped simi-insulating InP, and p-InGaAs on Si). It is contemplated that other suitable materials may be used. The SWS structure 49 can be realized by having a quantum dot channel (QDC) 50 which uses site-specific self-assembly of GeO$_x$-cladded Ge quantum dots (like layers 30 and 31 in FIG. 4a) on SWS quantum well structures. In one embodiment, the QDC-SWS structure may have one source region 150 (e.g. which may be an n+InGaAs layer achieved by re-growth technique) and its contact 240. Additionally, there may be two drains 57, 54, where one of the drains 54 (drain 2) contacts the lowest quantum well 45 and the other drain 57 (drain 1) contacts one or both of the quantum dot layers forming the QDC 50. The drain 54 (drain D2) has a contact 55 which is shown to be implemented using n+ regrowth 54, oxide isolation 53, and n+ regrowth 53. The drain 57 (drain D1) is realized by having regrowth region 56 in a manner that it is isolated from the other drain 54 (drain D2) by an insulating region 59. Drain D1 region 57 is contacted by contact 58 which forms one of the two outputs (V$_{out1}$ and V$_{out2}$) that are isolated. The gate insulator 36 is deposited on the top quantum dot layer of the QDC 50. The gate material is shown as 22 and the gate contact is shown as 23. In another embodiment, one could realize twin drain structure wherein each quantum dot layer is contacted separately without having a SWS structure.

Figure 7A:
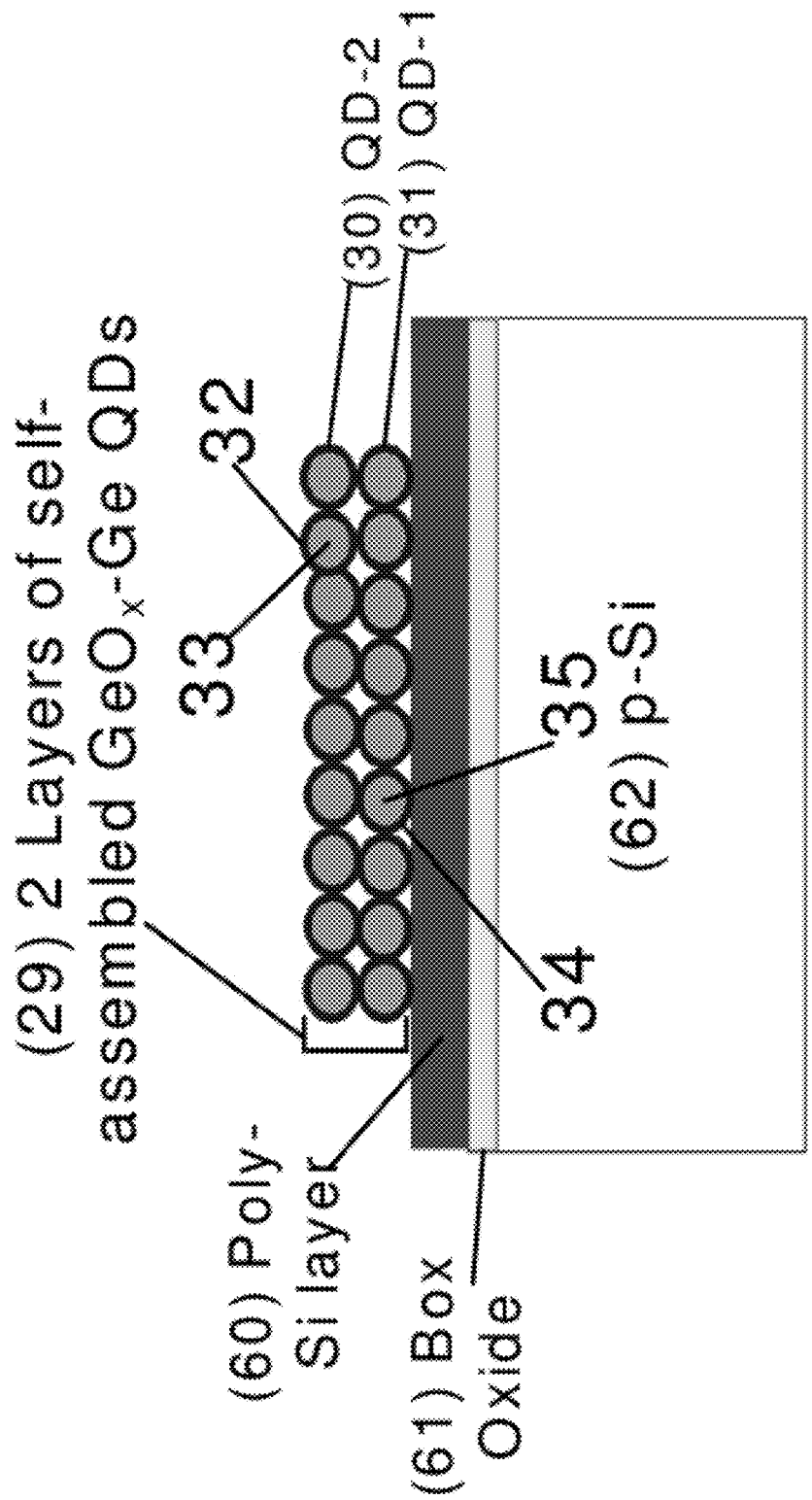
FIG. 7a schematic block diagram showing self-assembly of claddded GeOx-ge dots on p-poly Si, in accordance with the present invention.

FIG. 7a shows the deposition of GeO$_x$-cladded Ge quantum dot layers 30, 31, (respectively labeled as QD-2 and QD-1) on p-poly-Si 60. In this case, poly-Si is deposited on a silicon oxide layer 61 which is grown on a Si substrate or other suitable substrate material. This shows that cladded quantum dots can be deposited and a QDC FET can be fabricated on a poly-Si layer. In one embodiment, a stack of quantum dot layers, sandwiched between appropriate electrodes, can be used to fabricate ultrahigh value capacitors using series and parallel interconnects.

Figure 7B:
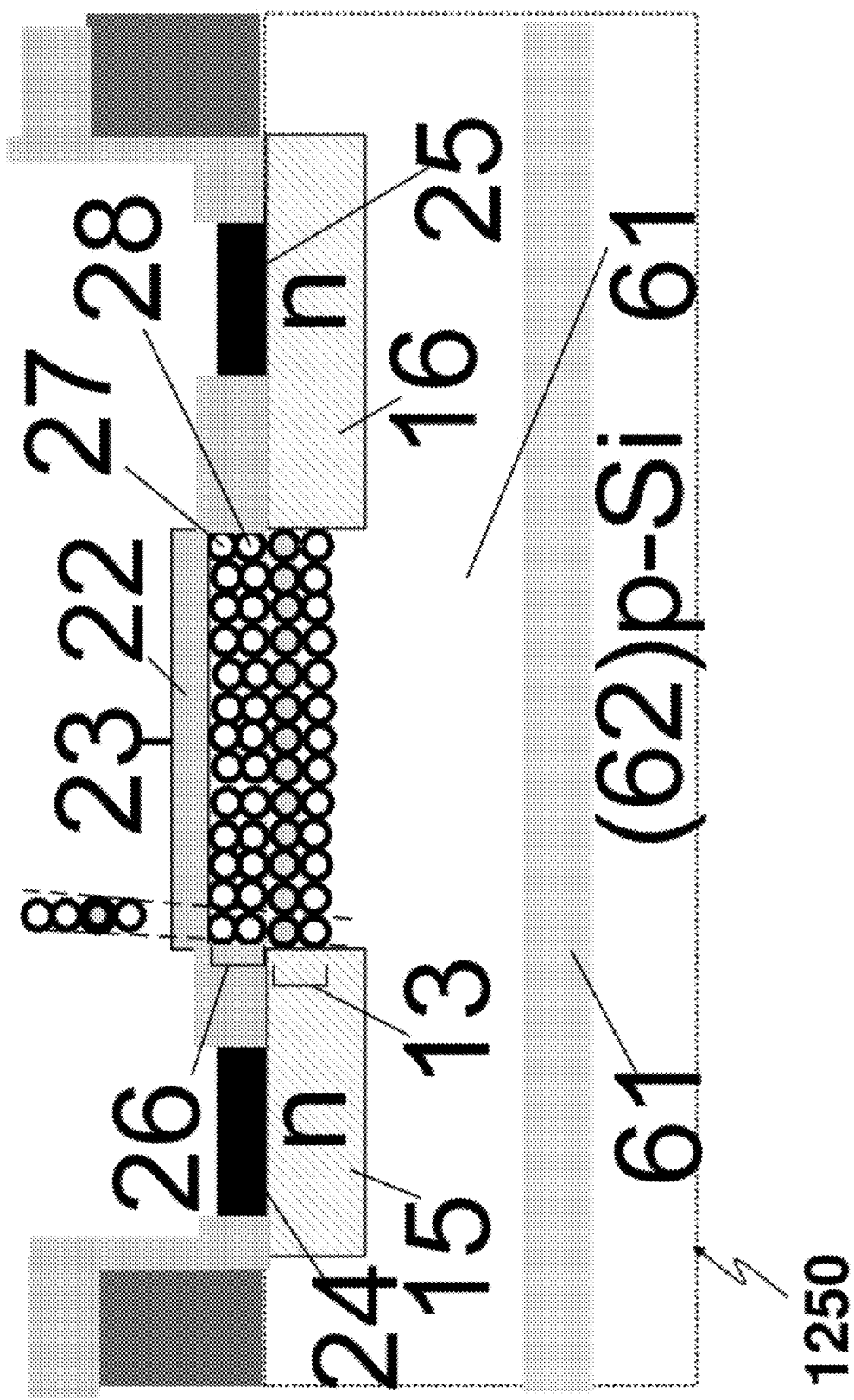
FIG. 7b is a schematic block diagram of a QDC FET in thin film transistor (TFT) configuration shown on a p-poly-Si layer, in accordance with the present invention.

FIG. 7b shows the schematic cross-section of a QDC-FET 1250, using $SiO_x$—Si quantum dot channel 13 self-assembled on a p-type poly-Si thin film. These quantum dot layers are similar to those shown in FIG. 3b and FIG. 3c where they were assembled on crystalline Si. In this case, the QDC dot layer is like 13 (See FIG. 3b) which have two layers of dots 110 and 12. It also has another set 26 of $SiO_x$—Si quantum dots which include a quantum dot top layer 27 and a quantum dot bottom layer 28.

Figure 7C:
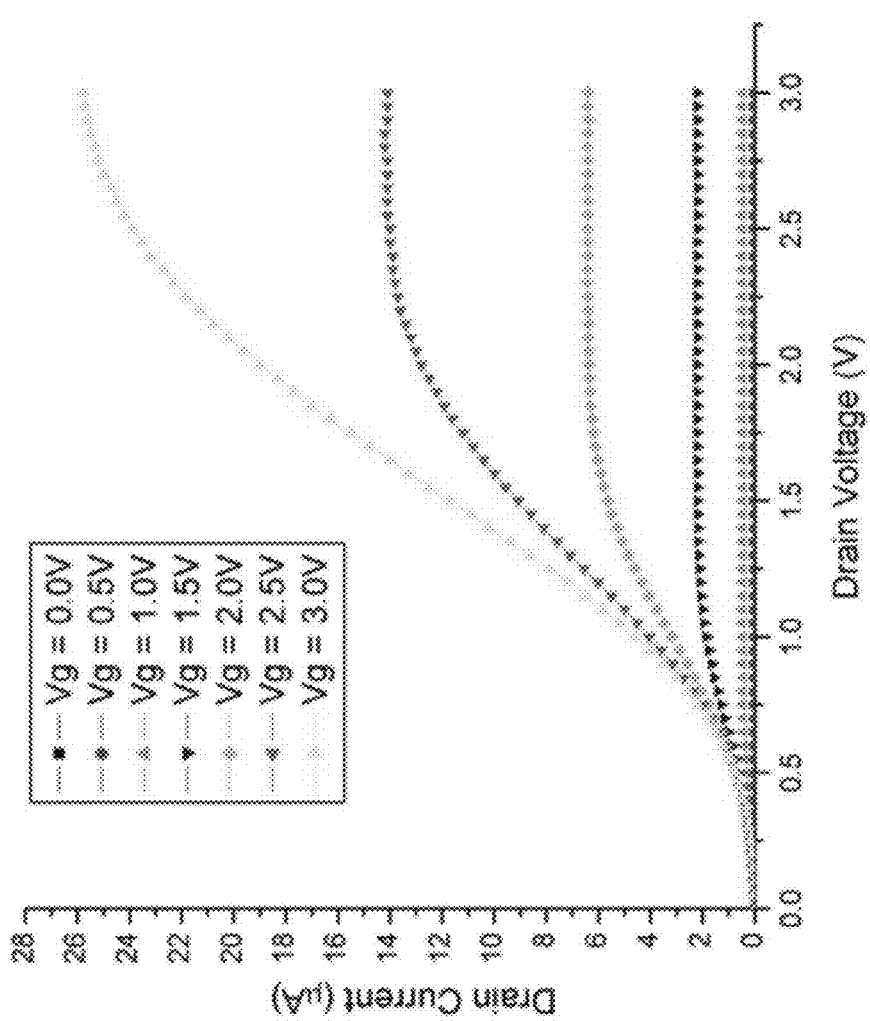
FIG. 7c is a graph illustrating the Id-Vd characteristics of the QDC-FET of FIG. 7b for varying gate voltages.
Figure 7D:
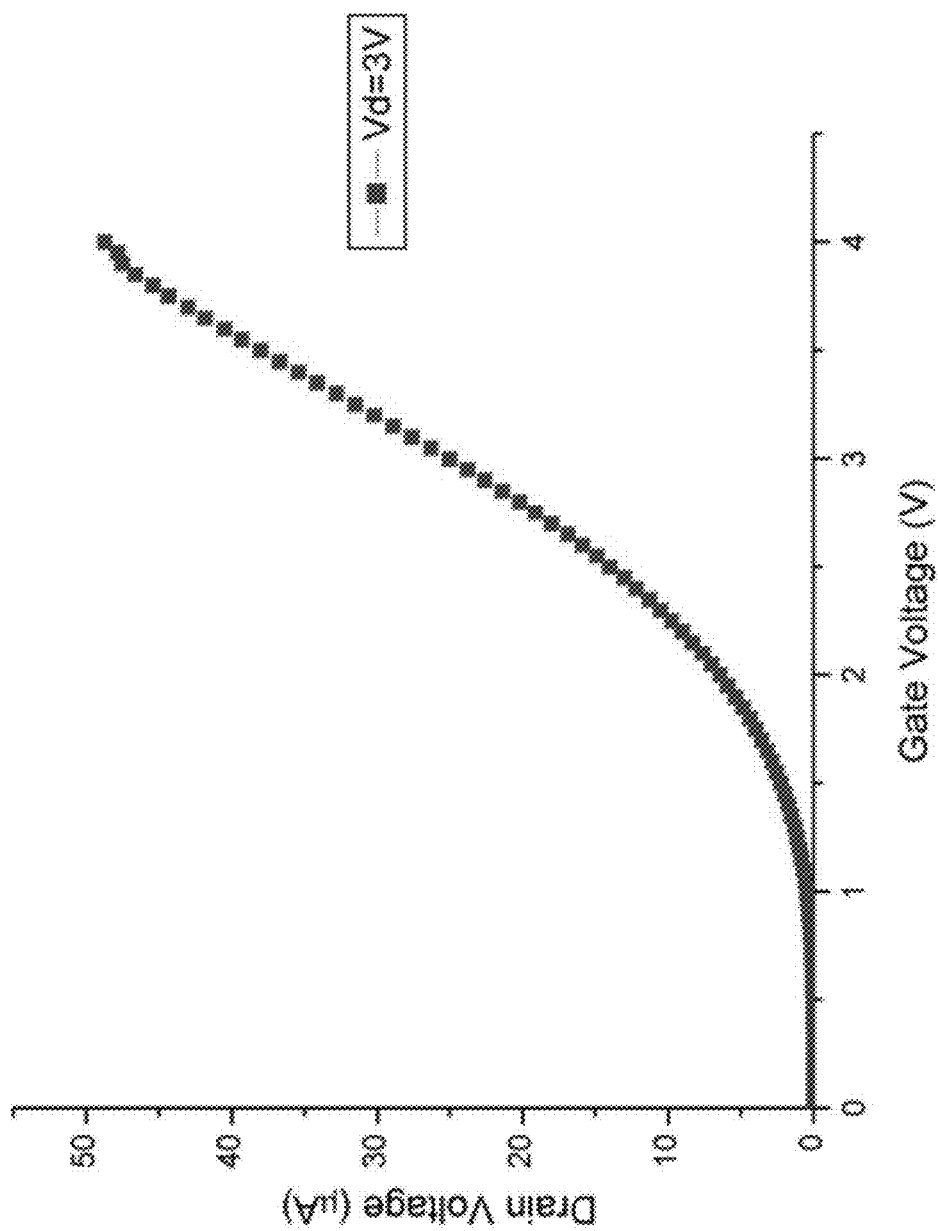
FIG. 7d is a graph illustrating the Current voltage transfer characteristics of a fabricated device shown in FIG. 7b.

FIG. 7c and FIG. 7d show the drain current-drain voltage and drain current and gate voltage characteristics, respectively of the QDC-FET 1250. It should be appreciated that QDC-FETs having higher channel mobility can thus be envisioned in materials which are poly-crystalline. They can also be used as thin film transistors (TFTs) for display and other applications.

Figure 8:
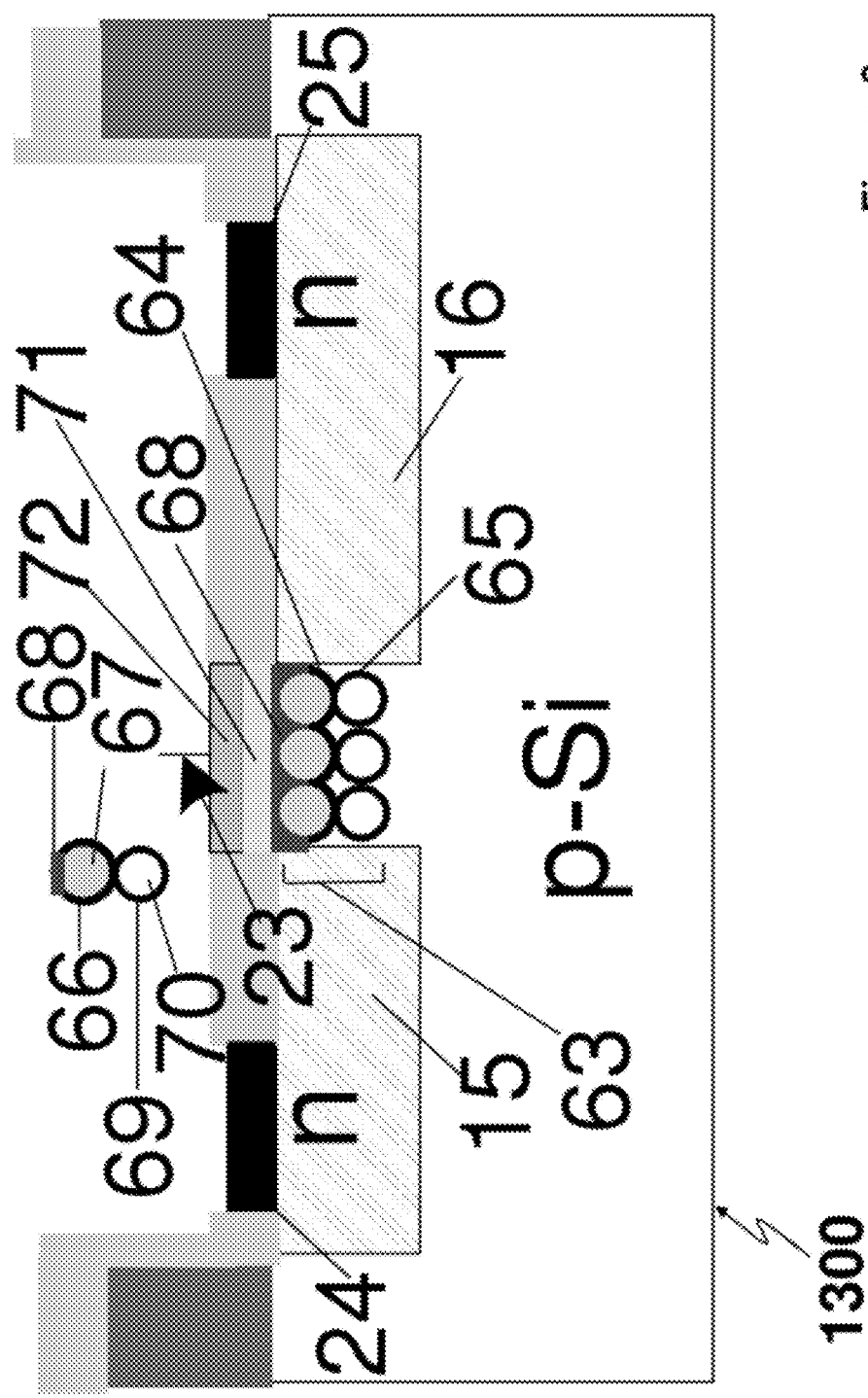
FIG. 8 is a schematic block diagram of a Quantum dot channel having dots cladded with SiO2 as well as an II-VI insulator, in accordance with the present invention.

FIG. 8a shows a device 1300 having a two layer (a quantum dot upper layer 64 and a quantum dot bottom layer 65) quantum dot channel 63 with three quantum dots. In this case, part of the upper layer quantum dot core 67 (which may be comprised of Si, Ge) is partially cladded with oxide 66 (SiOx for Si and GeOx for Ge) and the upper part 68 is cladded with other semiconductor layer (which may be comprised of II-VI, III-V, ternary and quaternary semiconductors). In the case of two or more layers quantum dot channel QDC, the oxide cladding (such as SiOx or GeOx as the case may be) from the top layer of QDots is removed to expose the semiconductor core. This is followed by growth of a lattice matched semiconductor layer 68 which may be comprised of Si, Ge, II-VI (such as ZnS, ZnMgSSe etc), III-V layer. This layer having a smaller barrier would modify the characteristics of the FET. In one embodiment, this would enhance mobility of the carriers in the quantum dot channel, where an inversion layer is formed. The layer 68 is deposited with a gate material 71 which may be comprised of lattice-matched semiconductors, HfO2, and/or other oxides. Finally, the gate material 72 is deposited and gate interconnect 23 is formed along with the source contact 24 and the drain contact 25.

Figure 9A:
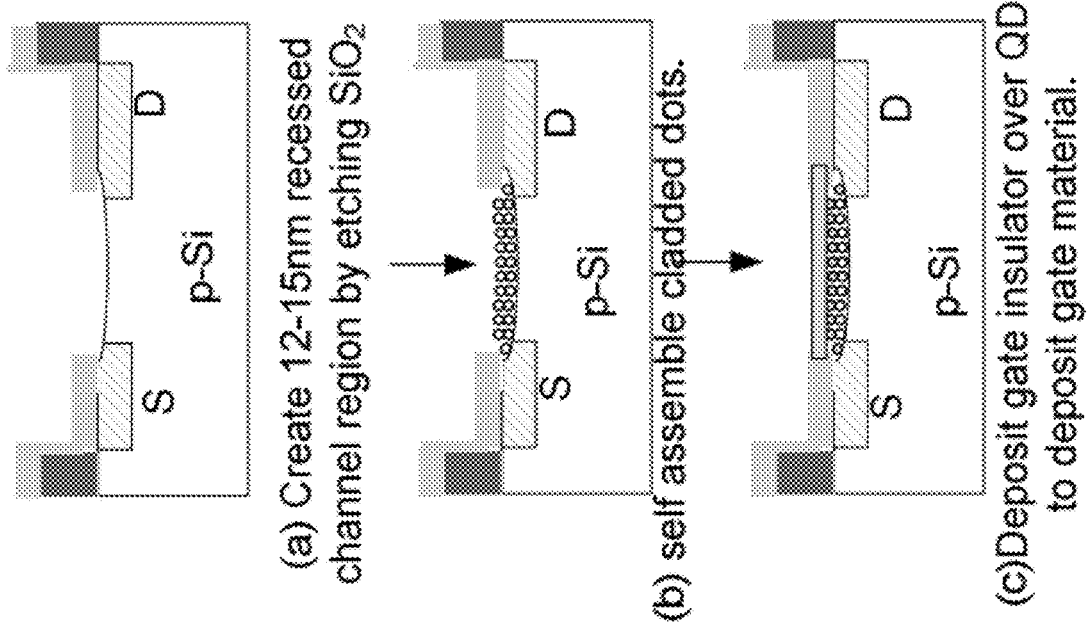
FIG. 9a is a schematic block diagram that illustrates an overall method of fabricating a quantum dot channel device, in accordance with the present invention.
Figure 9B:
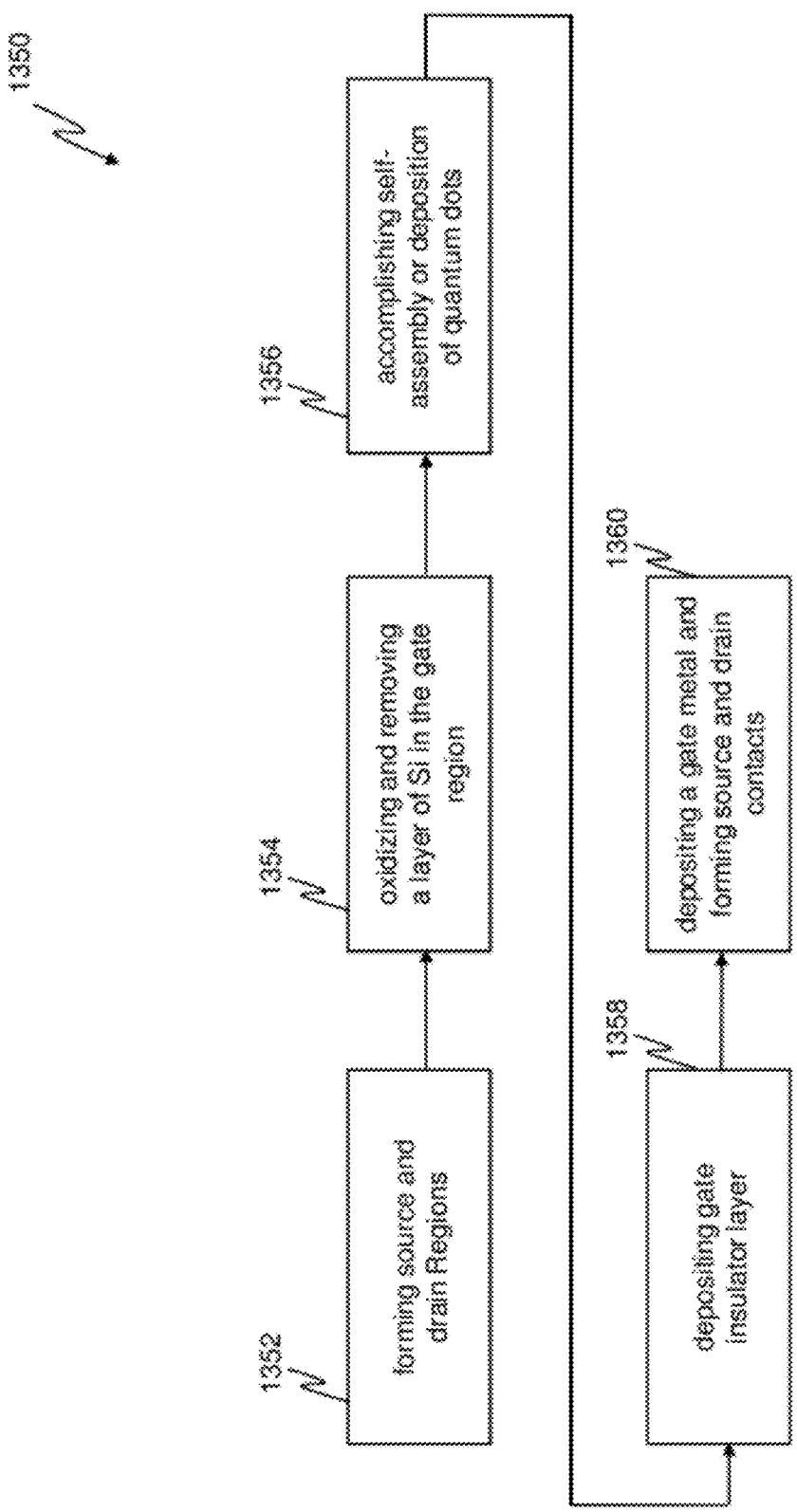
FIG. 9b is an operational block diagram that illustrates an overall method of fabricating a quantum dot channel device, in accordance with one embodiment of the present invention.

Referring to FIG. 9a and FIG. 9b, an operational block diagram 1350 illustrating a method of fabricating a quantum dot channel device is shown in accordance with one embodiment of the invention. Source and drain regions may be formed (this step may be at the end as well particularly when ion implants are used; we describe formation of long channel QDC-FETs) as shown in operational block 1352. A layer of Si is oxidized in the gate region and removed (forming a recessed region as shown in the FIG. 9a of the three cross-sectional schematics), as shown in operational block 1354. The self-assembly of cladded quantum dots or deposition of quantum dots is accomplished, as shown in operational block 1356 (depending on the application). A gate insulator layer is then deposited, as shown in operational block 1358. It should be appreciated that oxidizing part of SiOx cladding in the top QD layer can also be used and/or a combination of HfO2 and SiOx cladding can serve as the gate insulator. A gate metal is deposited and source and drain contacts are formed, as shown in operational block 1360. The procedure would vary in sub 22 nm FETs where source and drain extensions having low source and drain resistance are formed (for example, in smaller channels such as 22-nm FETs, the FETs have source and drain regions with n+ regions as well as n− extension (the n− extensions contact the QDC channel or inversion layer)). The structure may vary if FinFETs type structures are configured as QDC FETs. For example, FinFETs typically use a wrap around gate (from three sides) over the channel. In this case, the gate layer wraps around the QDC channel from three sides (only the substrate side is left without wrapping).

Figure 9C:
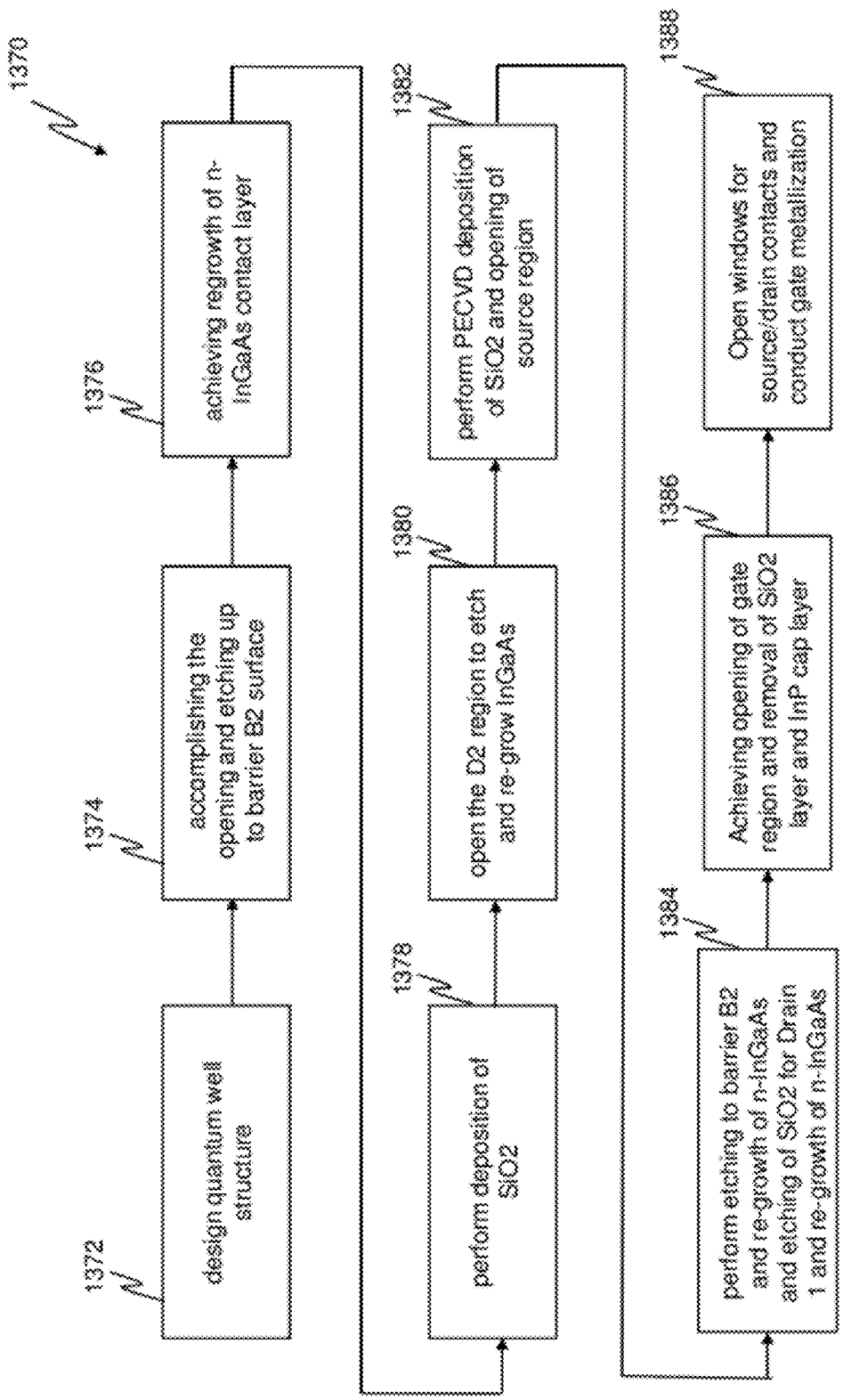
FIG. 9c is an operational block diagram illustrating a method of fabricating a quantum dot channel device with integrated SWS-channels and having twin drains, in accordance with one embodiment of the present invention.

It should be appreciated that for a QDC device with integrated SWS-channels and having twin drains (like FIG. 6), the process is little bit more involved. Referring to FIG. 9c, an operational block diagram 1370 illustrating a method of fabricating a quantum dot channel device with integrated SWS-channels and having twin drains is shown in accordance with one embodiment of the invention. The quantum well structure is designed, as shown in operational block 1372. The opening of drain D2 and etching up to the barrier B2 surface is then accomplished, as shown in operational block 1374. The regrowth of n-InGaAs contact layer is achieved, as shown in operational block 1376 and the deposition of SiO2 (via plasma enhanced chemical vapor deposition, PECVD) is performed, as shown in operational block 1378. Another mask is used to open the D2 region to etch SiO2 and re-grow InGaAs, as shown in operational block 1380, and PECVD deposition of SiO2 and opening of the source region is performed, as shown in operational block 1382. Etching to barrier B2 and regrowth of n-InGaAs is performed and etching of SiO2 for drain D1 and re-growth of n-InGaAs is accomplished, as shown in operational block 1384. Opening of the gate region and removal of the SiO2 layer and InP cap layer, followed by MOCVD growth of II-VI and/or another gate insulator layer is achieved, as shown in operational block 1386. At this point, the growth of II-VI (wide energy gap ~4 eV) gate insulators may be followed by opening the windows for the source/drain contacts (which involves wet or dry etching of the II-VI insulator, and deposition of source/drain Ohmic contacts), and the gate metallization may be conducted, as shown in operational block 1388. These masks may be used to fabricate SWS-FETs as desired (with asymmetric 3-coupled quantum wells on Si/SiGe and InGaAs—AlInAs epitaxial wafers).

Referring to FIG. 10a to FIG. 10e a nonvolatile memory is provided showing quantum dot set #1 forming the floating gate (G1) and quantum dot set #2 forming a channel that can facilitate charge removal from quantum dots in the floating gate region (over thin oxide) during the erase cycle.

Figure 10A:
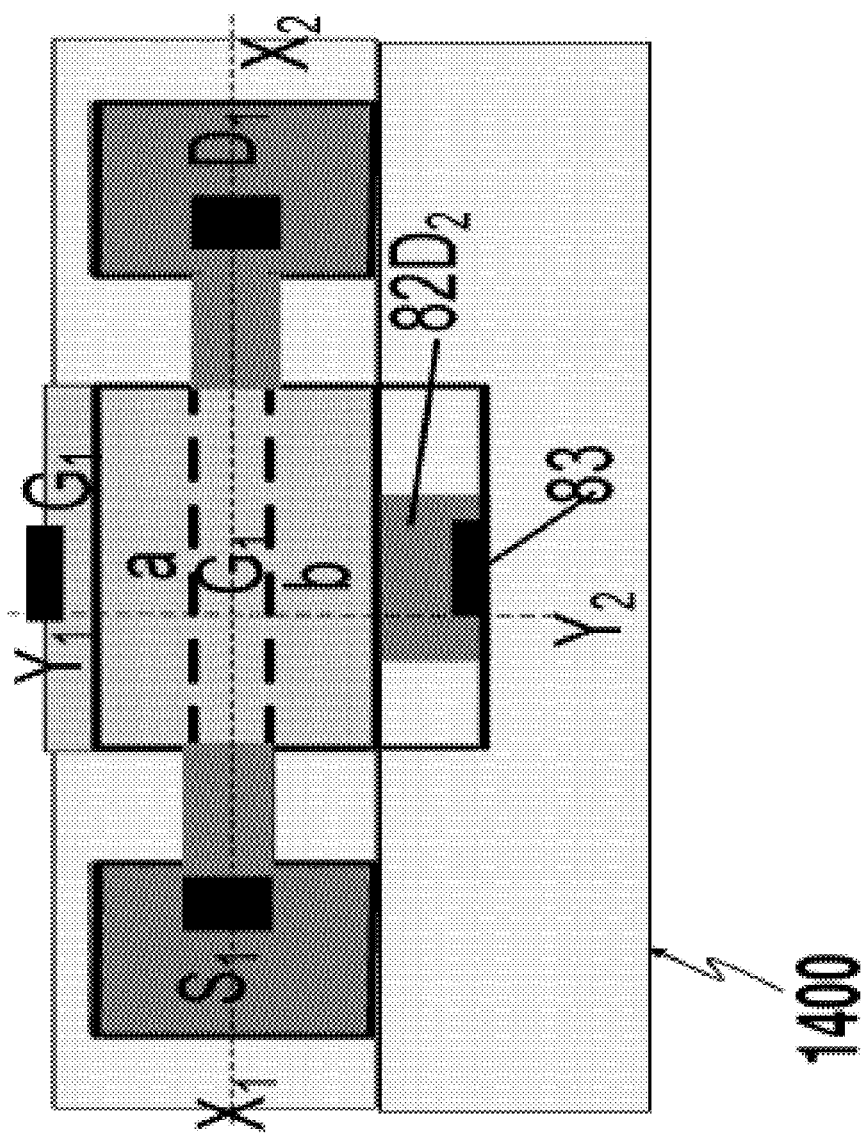
FIG. 10a is a schematic block diagram showing the top view of a nonvolatile random access memory, in accordance with the present invention.
Figure 10B:
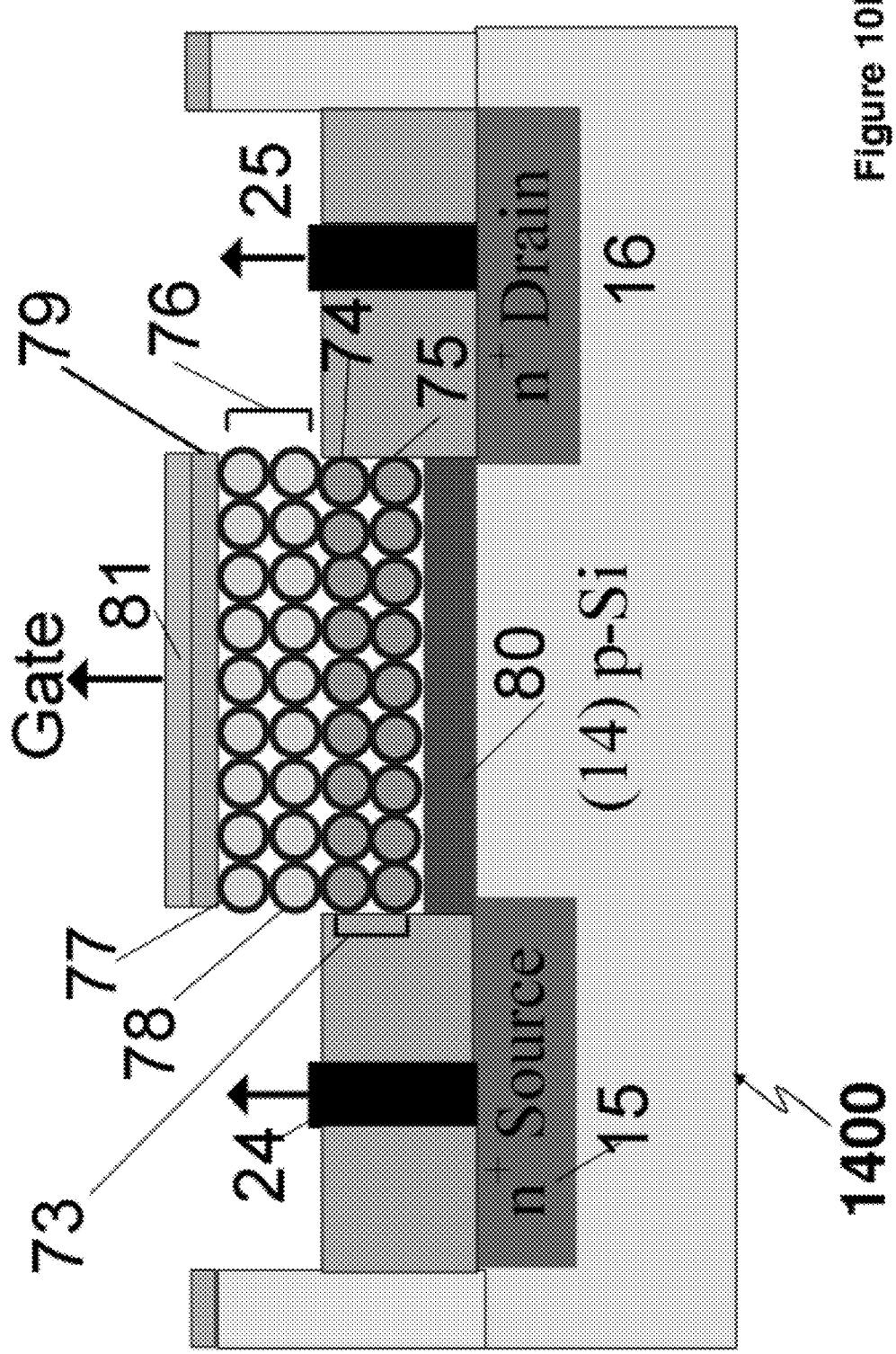
Figure 10C:
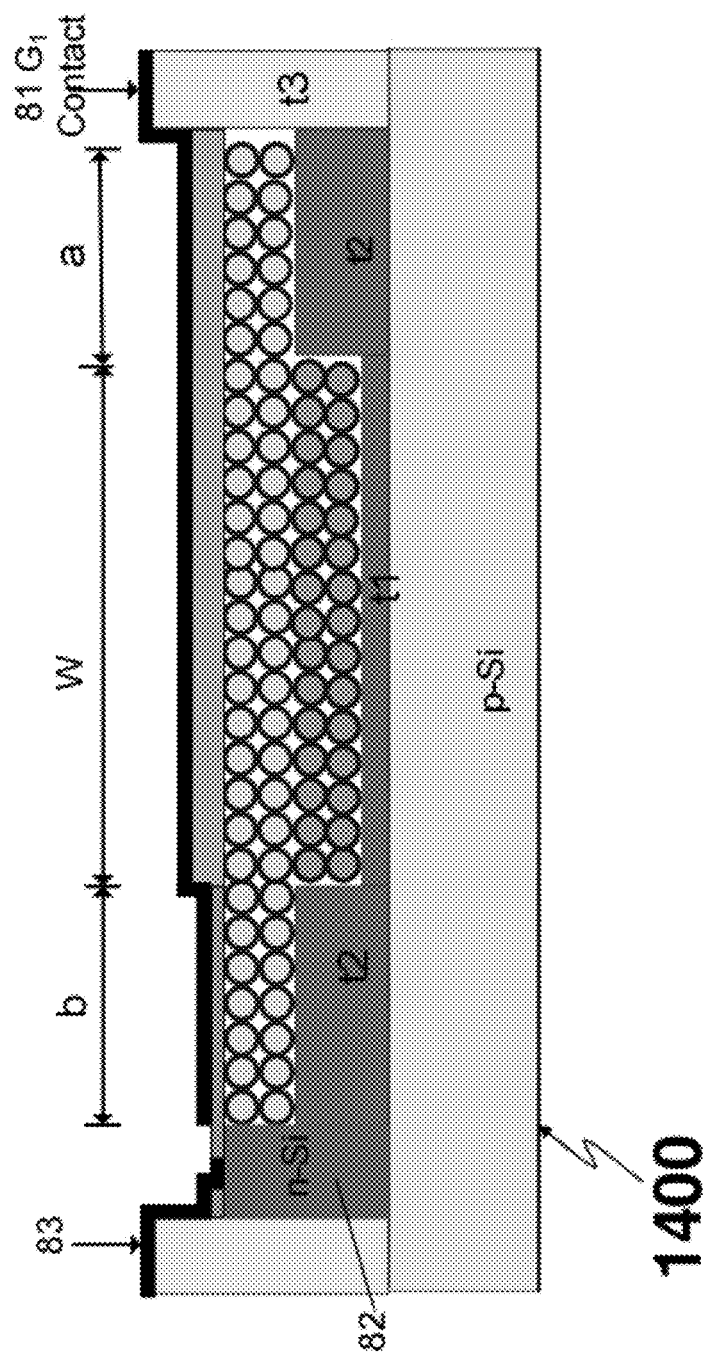

One embodiment of a nonvolatile random access memory (NVRAM) cell 1400 is shown in FIG. 10a, FIG. 10b and FIG. 10c and integrates features of a floating quantum dot gate (QDG) FET and a quantum dot channel FET. FIG. 10a shows the topological view of the NVRAM cell 1400, whereas FIG. 10b and FIG. 10c, respectively, show a cross-sectional schematic view across the $X_1$-$X_2$ and the $Y_1$-$Y_2$ axes. The floating quantum dot gate transistor is formed by source 15, source contact 24, drain 16, drain contact 25, floating gate 73 (which may be comprised of cladded quantum dot layers 74 (top) and 75 (bottom)), another set 76 of quantum dot array (two layers shown as 77 and 78), a control gate insulator 79, a tunnel gate insulator 80, and a control gate material 81 (which may be comprised of metal or poly-Si, poly Ge and which is shown to have a width W and length L). The gate 81 over the FET channel region is comprised of a thin tunnel insulator 80 having a thickness t1, a first set of quantum dot layer 73 (shown as having two layers 74, 75) and a second set of quantum dots 76 (shown as two quantum dot layers 77, 78) forming the quantum dot channel. A portion of these second set of quantum dots are deposited on thicker oxide (thickness t2 in regions labeled as "a" and "b", see FIG. 10c) outside the gate G1 81 along the $Y_1$-$Y_2$ axis. That is, the QDC-FET has channel dimension of W'×L (where W'=W+a+b). Here, the n-region is labeled as 82 (D2) and acts as the electrical contact to the inversion layer produced in the second set 76 of quantum dots when an above threshold voltage is applied to the W'×L gate of QDC-FET (using G1 81 contact). Contact to the n-region 82 is shown as G2 83. In another embodiment, the charge deposited on the quantum dot set 73 forming the floating gate of the nonvolatile memory is extracted by applying a voltage between G1 81 and source contact 24.

Figure 1B:
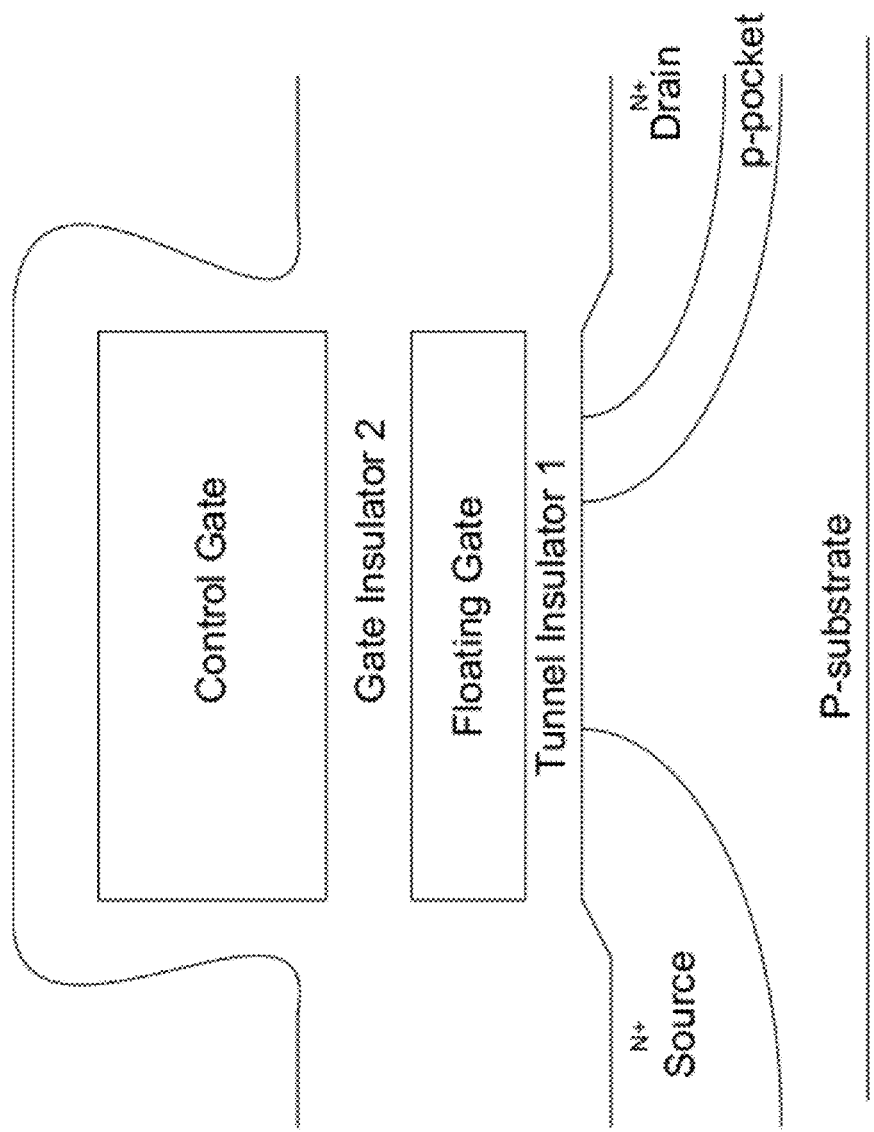
FIG. 1b is a schematic block diagram showing a floating gate memory cell with asymmetric source and drain, on the drain side, in accordance with the prior art.
Figure 1C:
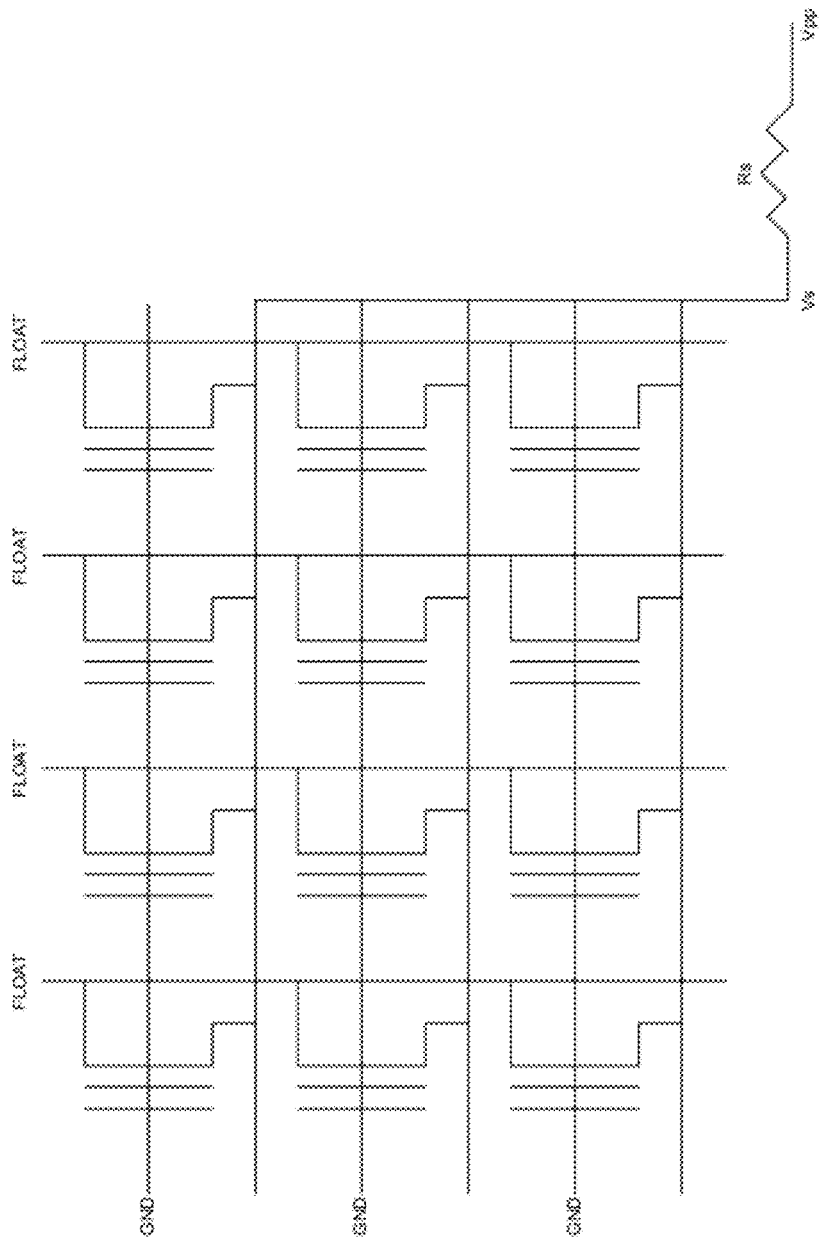
FIG. 1c is a schematic block diagram showing a floating gate memory cell with NOR array architecture illustrating erasing, in accordance with the prior art.
Figure 1D:
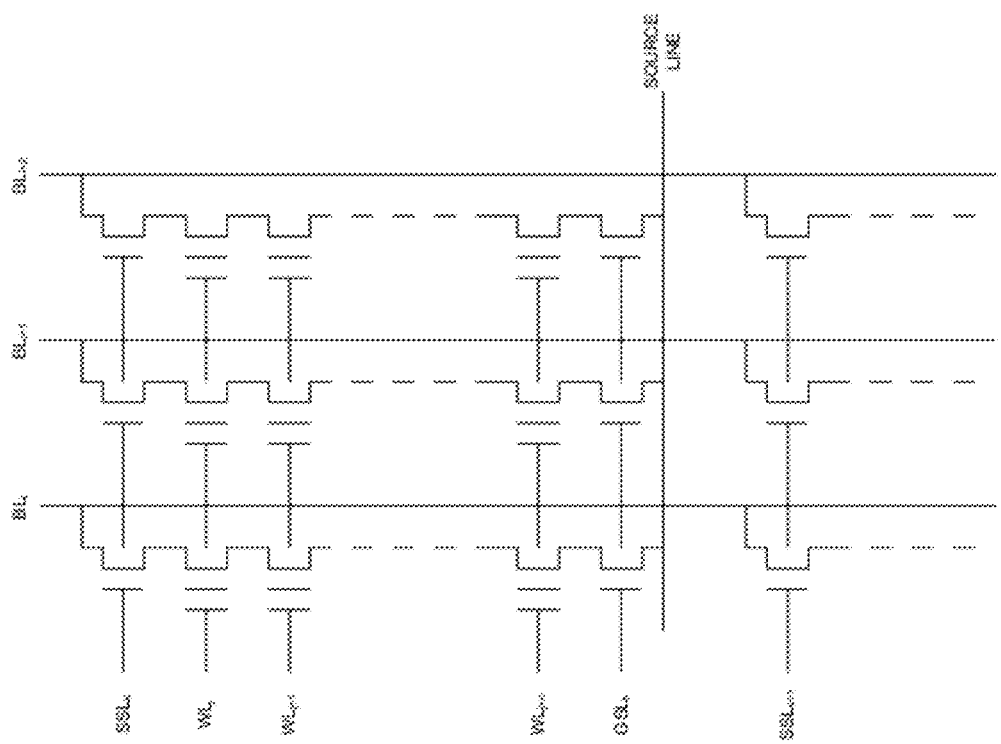
FIG. 1d is a schematic block diagram showing a floating gate memory cell with NAND array architecture, in accordance with the prior art.
Figure 2A:
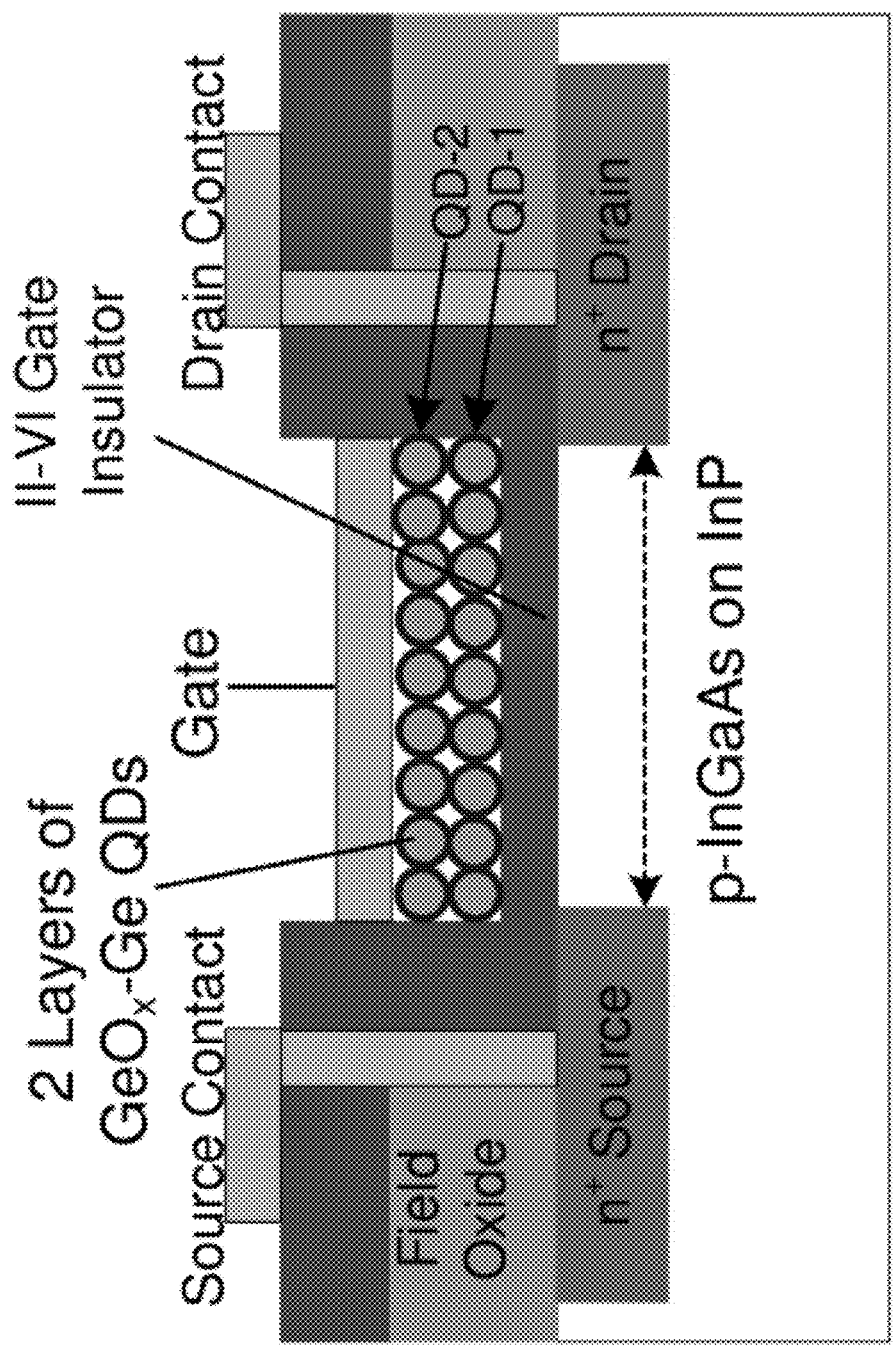
FIG. 2a is a schematic block diagram showing a quantum dot gate 3-state FET, in accordance with the prior art.
Figure 2B:
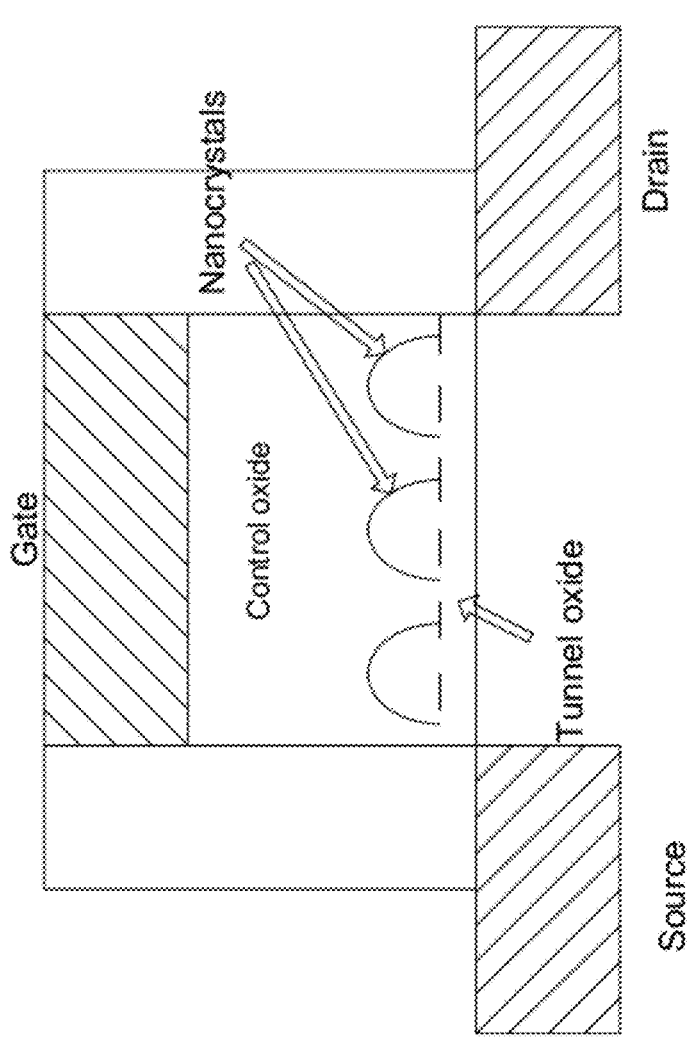
FIG. 2b is a schematic block diagram showing a conventional nanocrystal quantum dot floating gate memory, in accordance with the prior art.
Figure 10D:
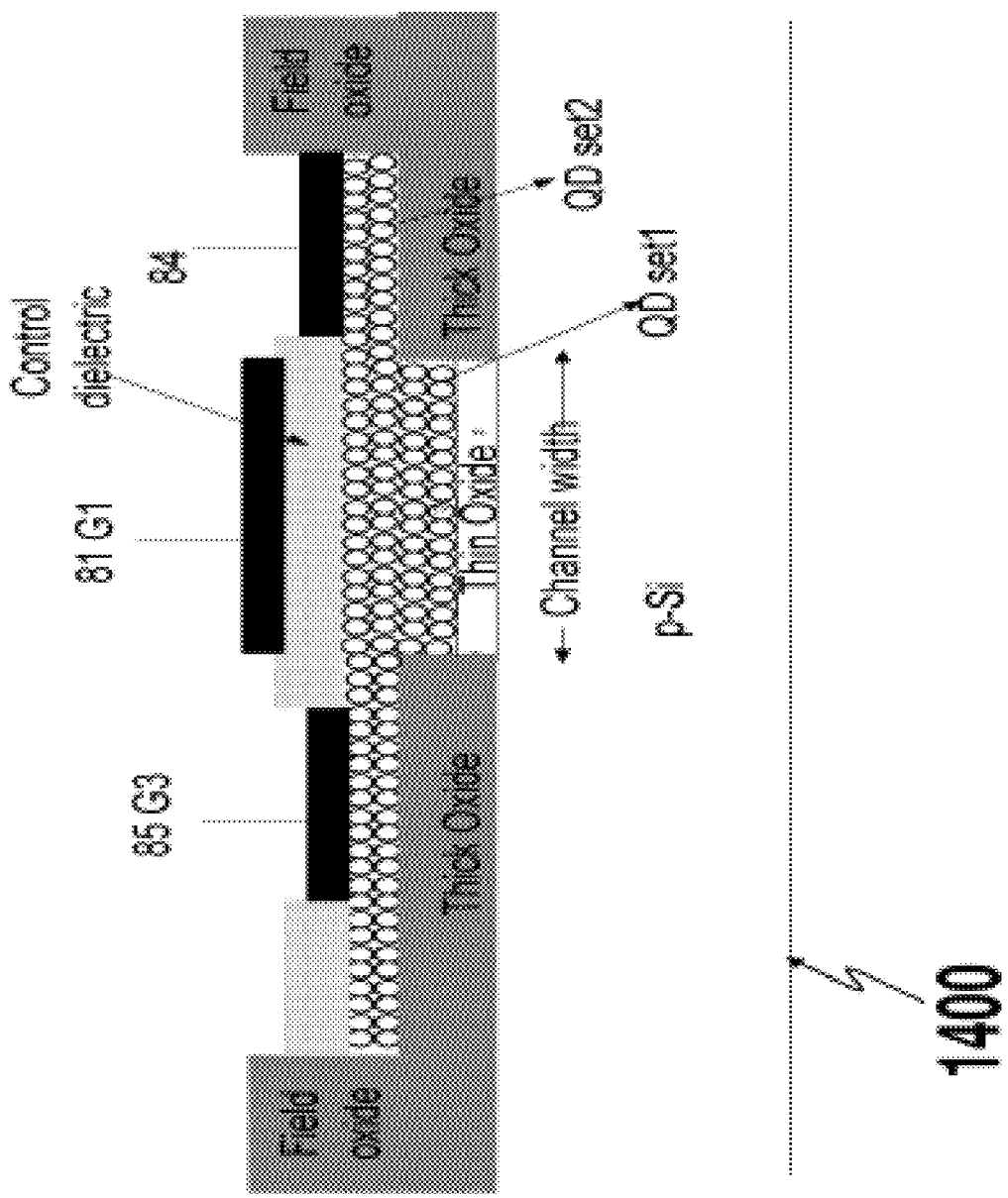
FIG. 10d is a schematic block diagram showing the cross-section along $Y_1$-$Y_2$ of the nonvolatile random access memory of FIG. 10a showing separate gates for erasing.

Referring to FIG. 10d, another embodiment of the NVRAM cell 1400 is shown, where FIG. 10d shows the lateral view illustrating the formation of two contacts to the QDC gates 84 and G3 85. Here, 84 and 85 can be connected together. In this embodiment, the formation of a quantum dot channel over the quantum dot floating gate enables charge transfer from floating gate dots via the source terminal (such as that shown in FIG. 1b). At least two schemes can be used to facilitate erasing. For example, use two gates G2 84 and G3 85 or connect G3 to G1 81 and gate G3 84 can be connected when insulator layer is thicker in the region identified as 'a' in FIG. 10c. In another embodiment, as shown in FIG. 10d the channel can be contacted using two independent contacts. This takes more real estate on Si. As a result, the two gates 84 and 85 can be consolidated.

Figure 10E:
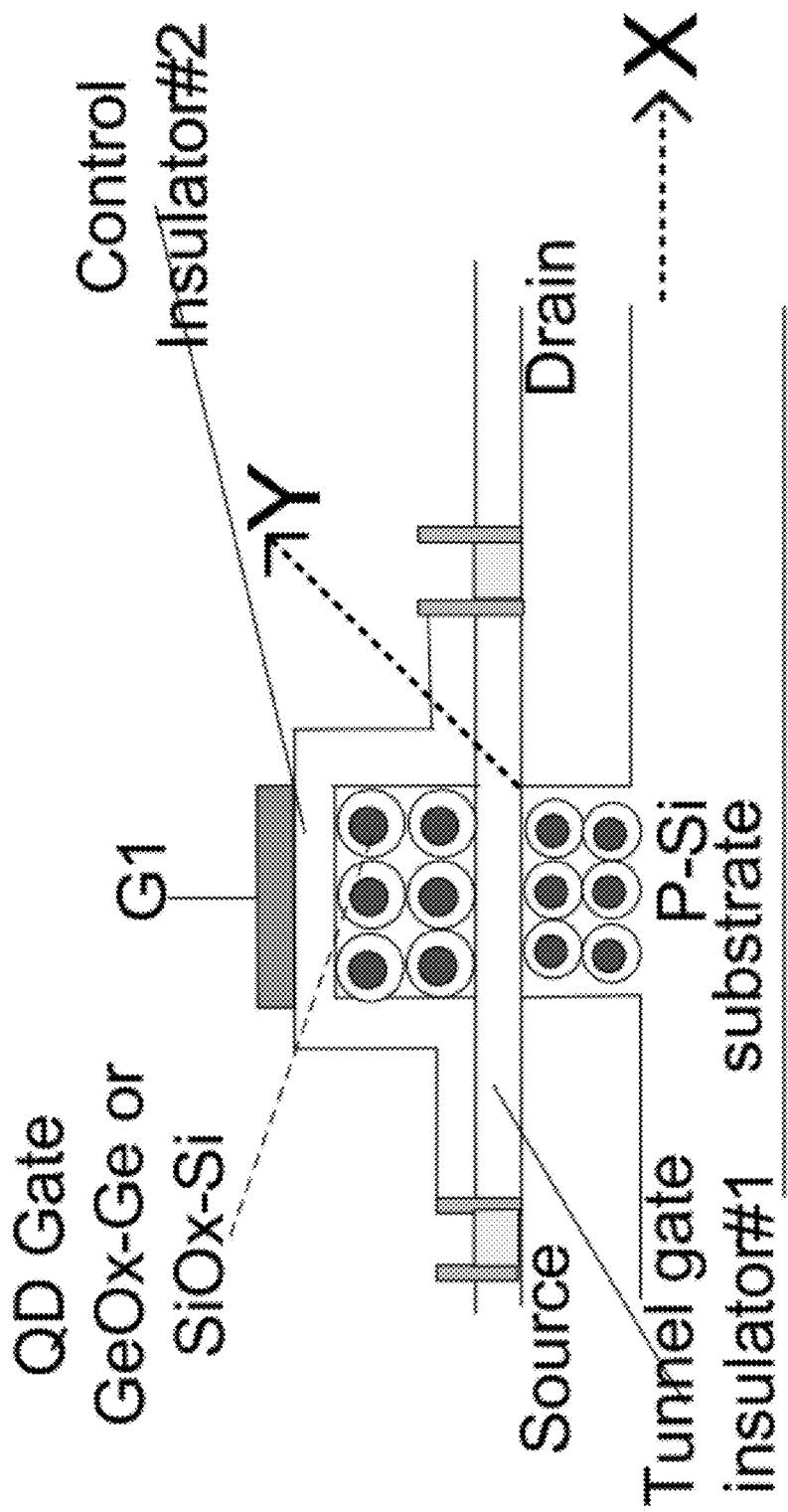
FIG. 10e is a schematic block diagram of a cross section of a sub-22 nm memory device with only 3×3 dots (i.e. 9 dots per layer).

FIG. 10e shows an embodiment where the memory device is sub 22 nm and only two layers of 3 cladded dots are shown as forming the floating gate. Here, the QDC channel accessing the floating gate is not shown.

Figure 11A:
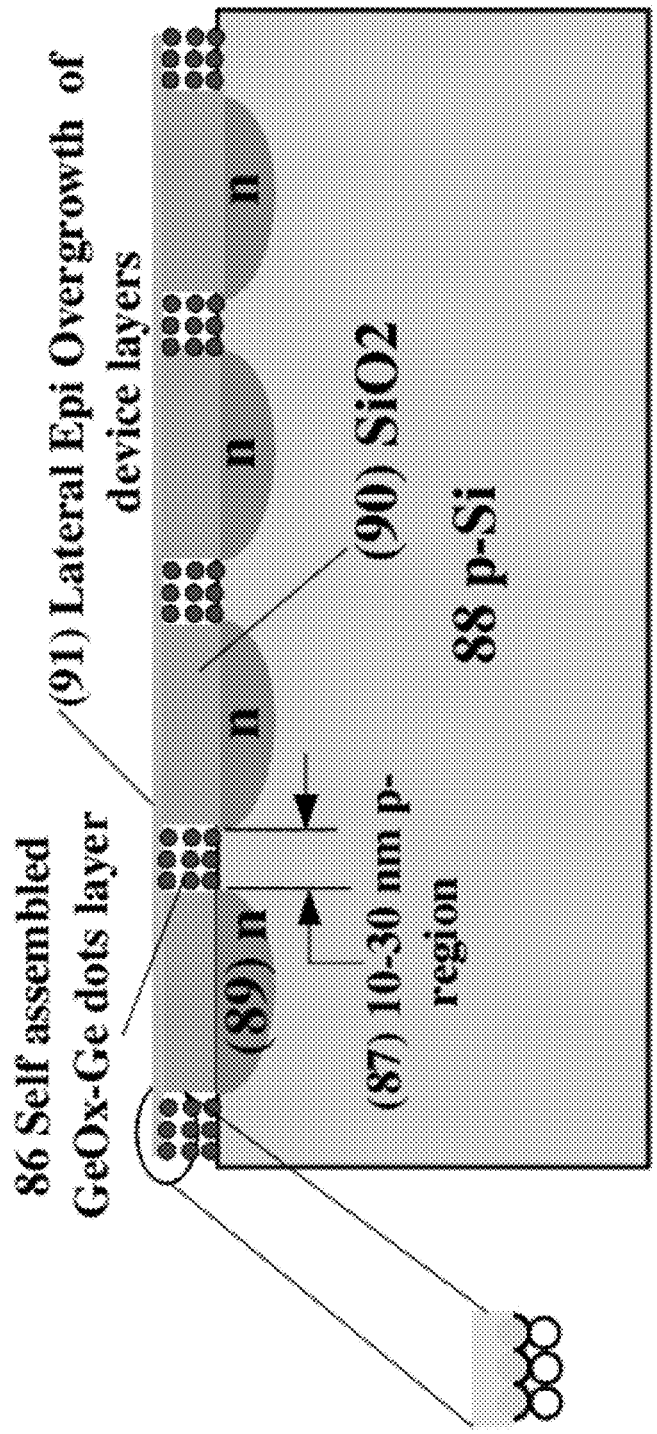
FIG. 11a is a cross-sectional schematic block diagram of a lattice mismatched epitaxial growth over Si where self assembled Ge quantum dots are used to seed epitaxial growth which laterally overgrows over SiO2 nanoislands resulting in nanodot mediated defect minimized heteroepitaxial growth.
Figure 11B:
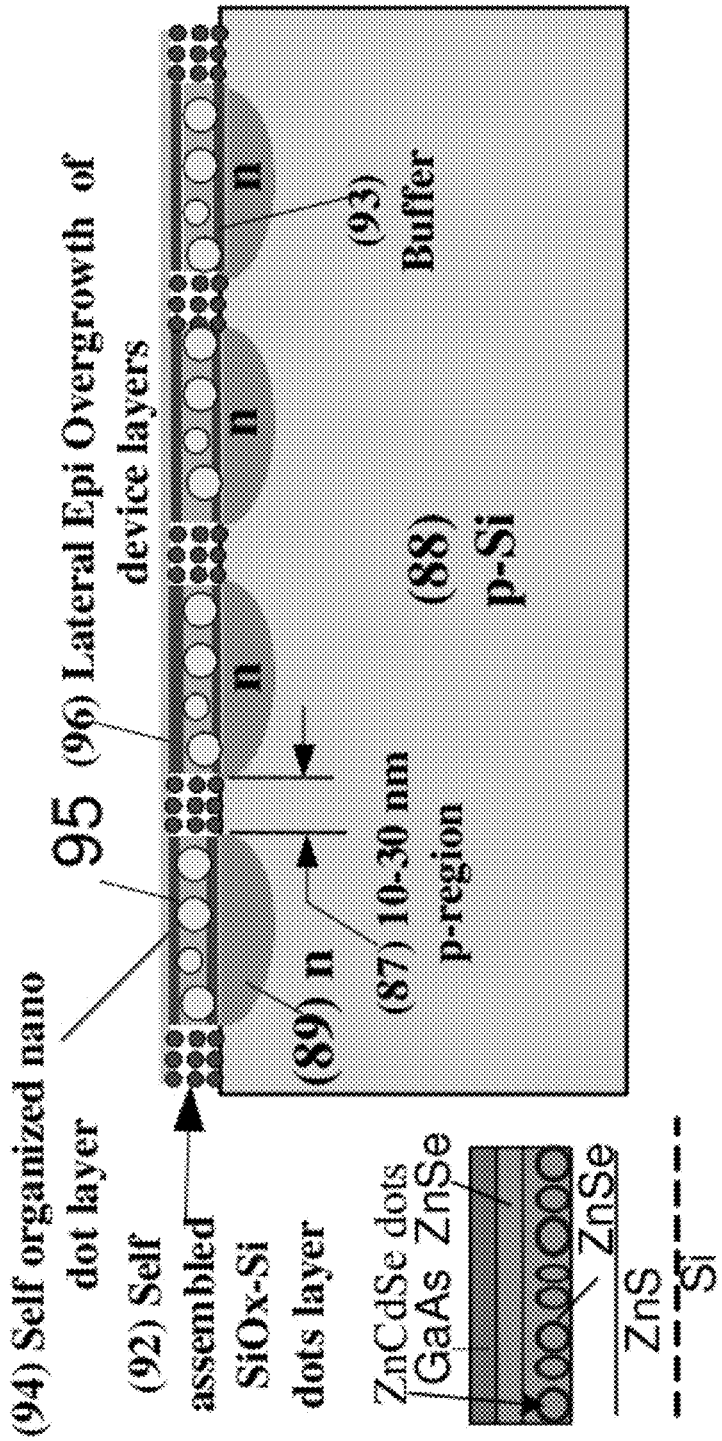
FIG. 11b is a schematic block diagram showing self-organized quantum dot mediated growth of lattice-mismatched heteroepitaxy of III-V and II-VI device layers on Si substrates.

Referring to FIG. 11a and FIG. 11b, quantum dot mediated growth of lattice-mismatched heteroepitaxy of III-V and II-VI device layers on Si substrates are shown. The use of self-assembled and self-organized nanodots is described to grow mismatched layers on Si substrate with reduced defect density. FIG. 11a shows the methodology of first forming a layer of cladded quantum dots 86 (selected from SiOx-Si and GeOx-Ge) on p-type nanopatterned regions 87 on 88 p-Si layer or substrate, where the nanopatterns may be created by n-doping 89. It should be appreciated that other method for creating nanopatterns may be used. For example, nanopatterns may be created by using lithography. It should be appreciated that, as shown in FIG. 11a, the self-assembled Ge quantum dots are used to seed epitaxial layers which are having little mismatch with Ge such as GaAs or ZnSe or ZnSSe and/or another suitable material.

The quantum dot regions 86 are separated by oxide, such as SiO2 90. However, other materials may be used to separate the quantum dot regions 86. This is followed by the removal of part of the thin oxide cladding from the top layer of the Ge quantum dots (such as shown in the inset, see also FIG. 8). One method to remove GeOx cladding involves exposing these quantum dots to a germane gas (such as GeH4) at 400-600 C range for a desired duration depending on the ambient and vacuum conditions. This is because the germane gas reacts with oxides, such as GeOx and SiOx, around about 400-575 C where it slowly removes the cladding. Once the Ge or Si quantum dot is exposed, it can be used to grow a ZnSe layer which can laterally grow over the region 89. The epitaxial layer 91 of material selected from II-VI (ZnSe or ZnSSe) and III-V (such as GaAs) can now be nucleated on an exposed surface of the top layer of Ge quantum dots. The lateral overgrowth on SiO2 regions 89 of this layer results in epitaxial layers. Referring to FIG. 11b, a methodology for forming an epitaxial layer when self-organized quantum dots are used is discussed. In this case, the Si substrate 88 is patterned to create an n-region 89 and a p-region 87 to realize the self-assembly of SiOx-cladded Si nanodots 92 (on p-regions). The nanoislands 89 are subsequently used to realize self-organized quantum dots 94, which require the growth of a buffer layer 93 (which may be comprised of ZnS, ZnMgS layer). Details are shown in the inset. The buffer layer 93 is deposited with mismatched layers such as ZnSe and CdSe which form self-organized nanodots 94 (shown as ZnCdSe) due to strain. Subsequently, a layer 95 which has a lattice constant in between the ZnCdSe quantum dots and Si is grown. The structure is annealed to glide dislocations created due to lattice mismatch. Since the island is small, the number of dislocations is very small and they are also annihilated due to annealing. Now a device layer, such as ZnSe or ZnSSe and/or GaAs (other suitable materials may be used) is grown. This lateral epitaxial overgrowth takes place over the self-assembled SiOx-Si quantum dots as well, yielding a planar structure. This can be used to realize solar cells, GaAs-on-Si or with appropriate changes InGaAs-on-Si FETs.

Figure 12A:
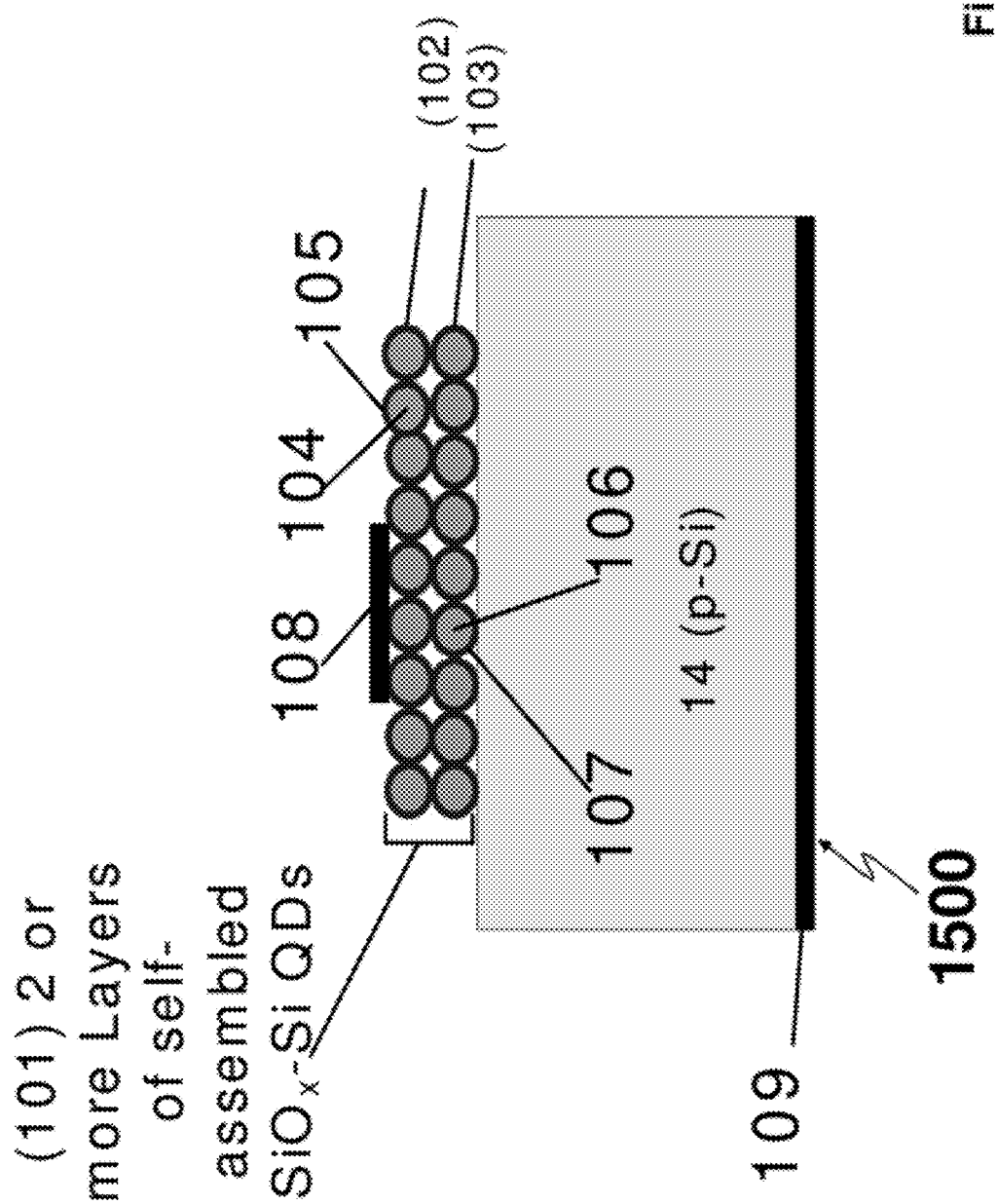
FIG. 12a is a schematic block diagram of a p-n junction diode which has an n-layer of Quantum Dot Superlattice (QDSL) and p-layer of a conventional semiconductor material, in accordance with the present invention.
Figure 12B:
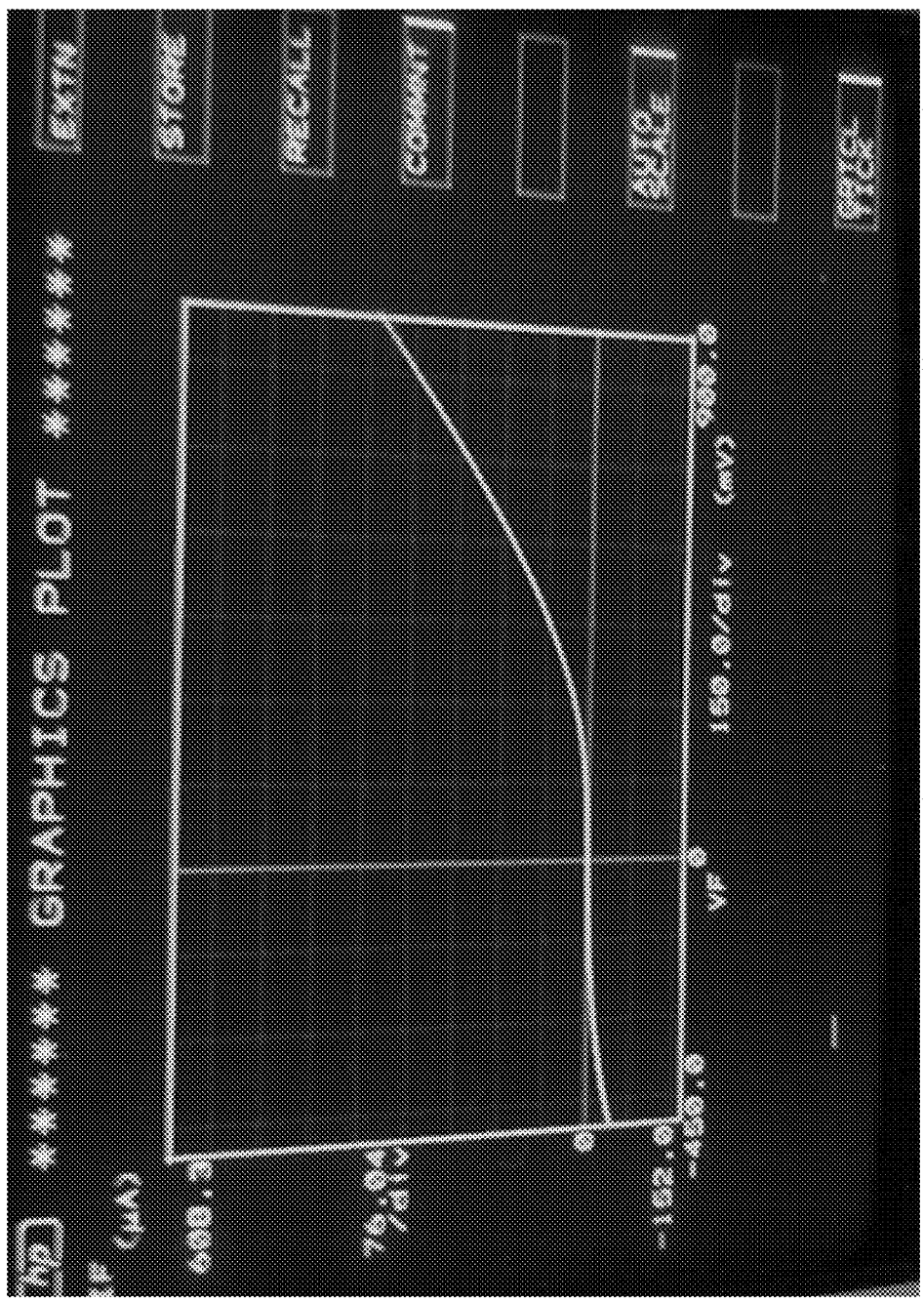
FIG. 12b is a screen printout of a graphic plot illustrating the voltage-current characteristics of the fabricated diode of FIG. 12a, in accordance with the present invention.

It should be appreciated that a 2-dimensional or 3-dimensional array of cladded quantum dots can be employed as a layer which behaves like a quantum dot superlattice (QDSL). Unlike conventional one-dimensional superlattice which form energy minibands along one axis, the QDSL is formed along three axes for multiple quantum dot arrays (if there is only one array of quantum dots then a 2-dimensional superlattice can be formed). The proof of concept includes a basic n-QDSL/p-cSi diode (see FIG. 12b). It should be appreciated that other solar cells can be fabricated using n-QDSL/p-aSi cells. FIG. 12a shows a schematic block diagram of a SiOx-Si QDSL 1500 which behaves as a wider energy gap layer having an energy gap greater than Si. FIG. 12a shows a set of quantum dots 101 (two layers shown as 102 and 103) self-assembled on a p-Si substrate or p-type thin film 14. The quantum dots 101 have thin cladding 105 and 107 and cores 104 and 106, respectively, for the top and bottom QD layers 102, 103. More layers could also be used depending on the thickness of the QDSL required. A bottom Ohmic contact 109 is formed on pSi and a metal layer is deposited to form the upper contact 108. This upper contact 108 could be a metal-thin insulator (SiOx cladding)-semiconductor (n-Si dot core) interface. FIG. 12b shows V-I plot of a fabricated n-QDSL/p-Si diode. This could be improved by adjusting the cladding layer as well the processing and/or annealing time.

Figure 12C:
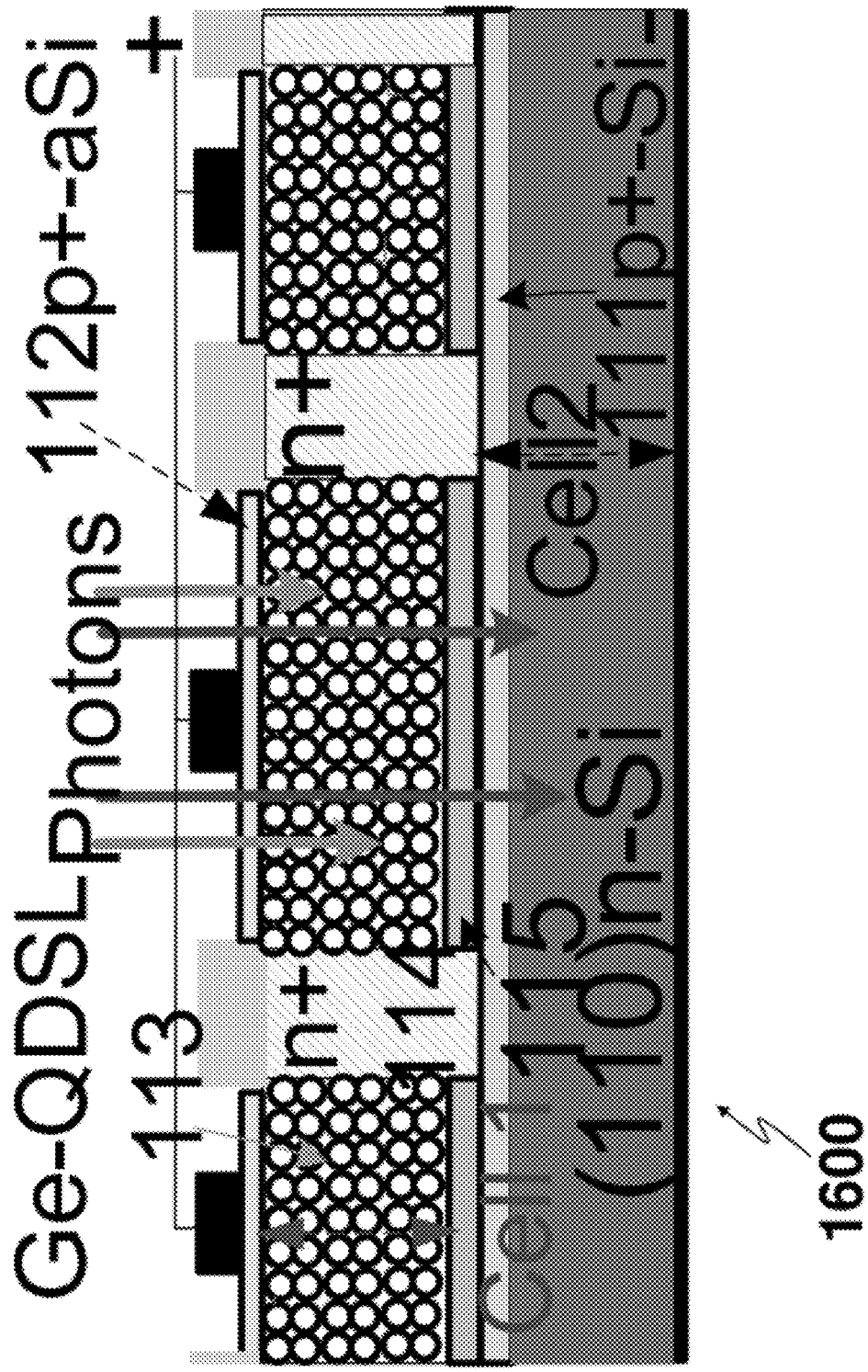
FIG. 12c is a schematic block diagram of a two cell tandem solar device using GeOx-Ge QDSL layer as an absorber for one cell (i.e. cell 1) where the other cell (i.e. cell 2) is a conventional Si cell, in accordance with the present invention.
Figure 12D:
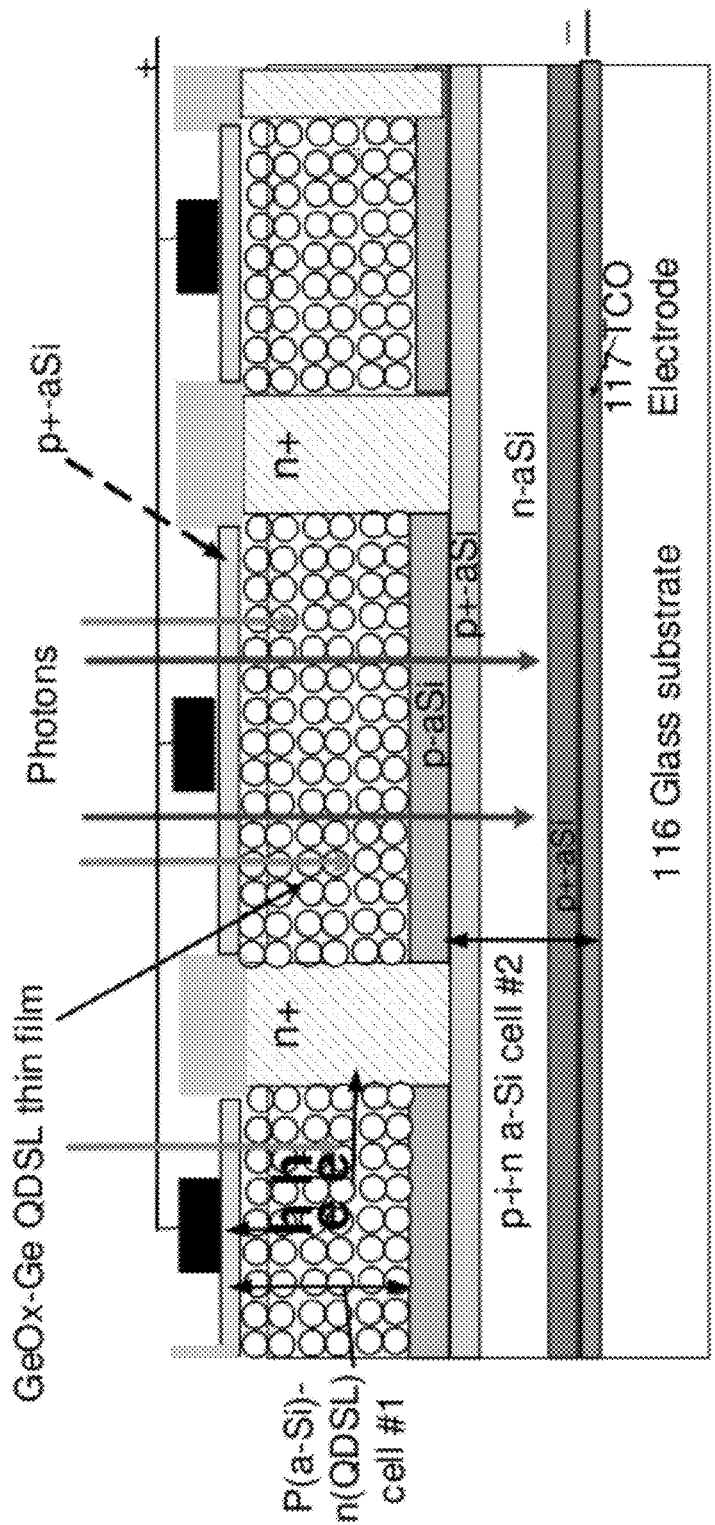
FIG. 12d is a schematic block diagram of a two cell tandem solar device using a QDSL layer as an absorber for one cell (i.e. cell 1) where the other cell (i.e. cell 2) is a conventional amorphous Si cell realized on a glass substrate, in accordance with the present invention.

FIG. 12c shows a tandem solar cell structure 1600 where the QDSL layer 113 is formed (by site specific self assembly on p-Si layer 115) using GeOx-Ge quantum dots as the absorber layer. FIG. 12c shows a 2-cell tandem structure incorporating GeOx-Ge QDSL based cell #1 and Cell #2 (which is a conventional Si cell having a p+Si 111/nSi 110 device). Cell #1 comprises a p+aSi layer 112 and a GeOx-nGe QDSL 112 layer forming p+-n heterojunctions cell. The n+ regions 114 facilitate the collection of photogenerated carriers, and they also form a tunnel junction with a p+Si layer 111. Since the quantum dot arrays have been site-specifically assembled on a variety of single crystals (Si, Ge, InGaAs) as well as nano/poly-Si substrates, we do not envision any problems in regards to their deposition on amorphous thin films. Accordingly, they could be deposited on amorphous thin films, as shown in FIG. 12d, where this structure is similar to that of FIG. 12c with the difference that here amorphous Si thin films are used on a glass substrate 116 coated with transparent conducting oxide (TCO) 117. Cell 2 is a p-i-n amorphous Si cell and cell 1 is a p-amorphous Si (top layer) and GeOx-Ge QDSL absorber layer.

Figure 13:
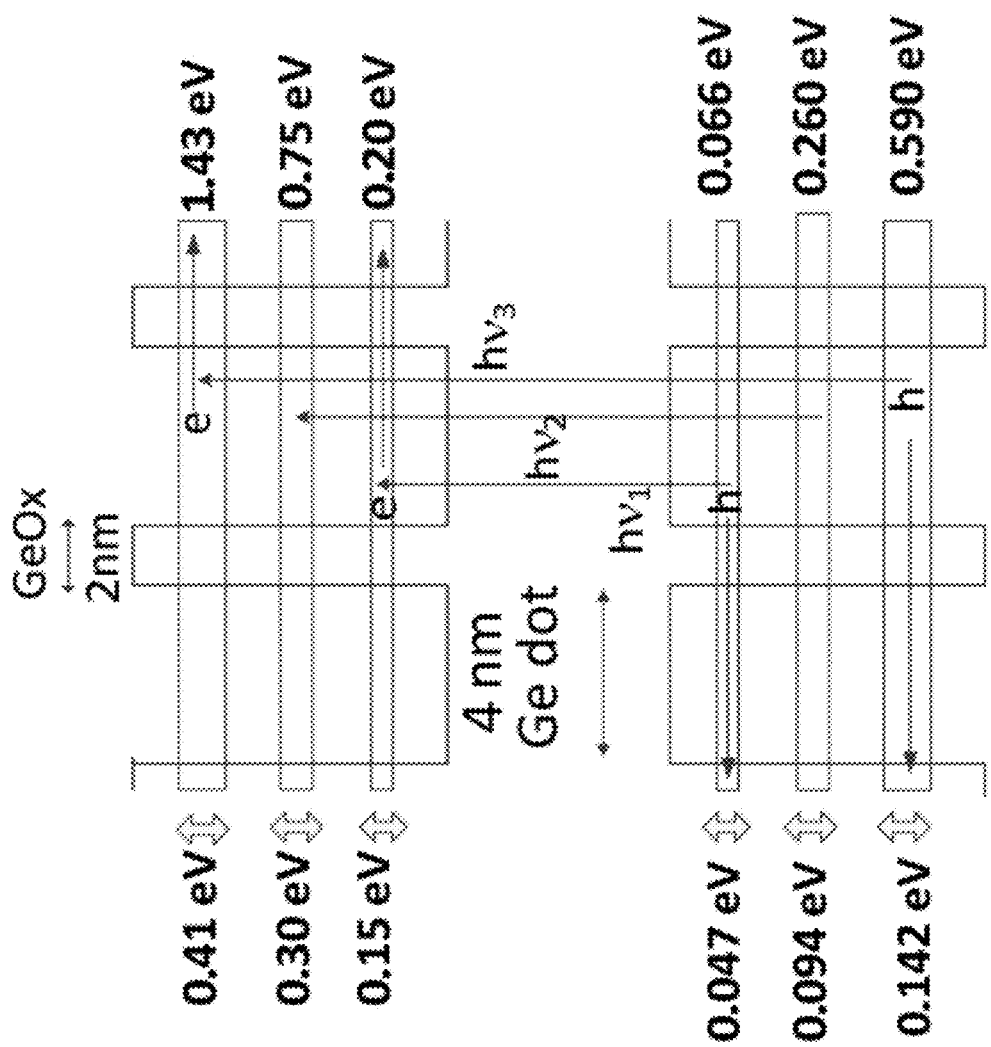
FIG. 13 is a illustration of GeOx-Ge quantum dot superlattice energy minibands formed when the barrier layer thickness between to adjacent dots is small (about 2 nm).

Quantum dot superlattice (QDSL): FIG. 13 shows schematically the computed energy mini-bands (using one-dimensional model) for self-assembled $GeO_x$-cladded-Ge QDSL, where the dots (4 nm) are coupled via a thin barrier (2 nm). Here, we show the formation of the mini-energy bands which are similar to those formed in quantum well superlattices. These energy bands are above the bulk energy gap in the conduction and valence bands. In FETs, minibands in the conduction band or valence band are relevant to current conduction. In the case of p-n diodes or solar cells using at least one layer of QDSL, minibands in the conduction as well valence band are important. For example, the photogenerated carriers are collected via transport using mini-bands.

Figure 14:
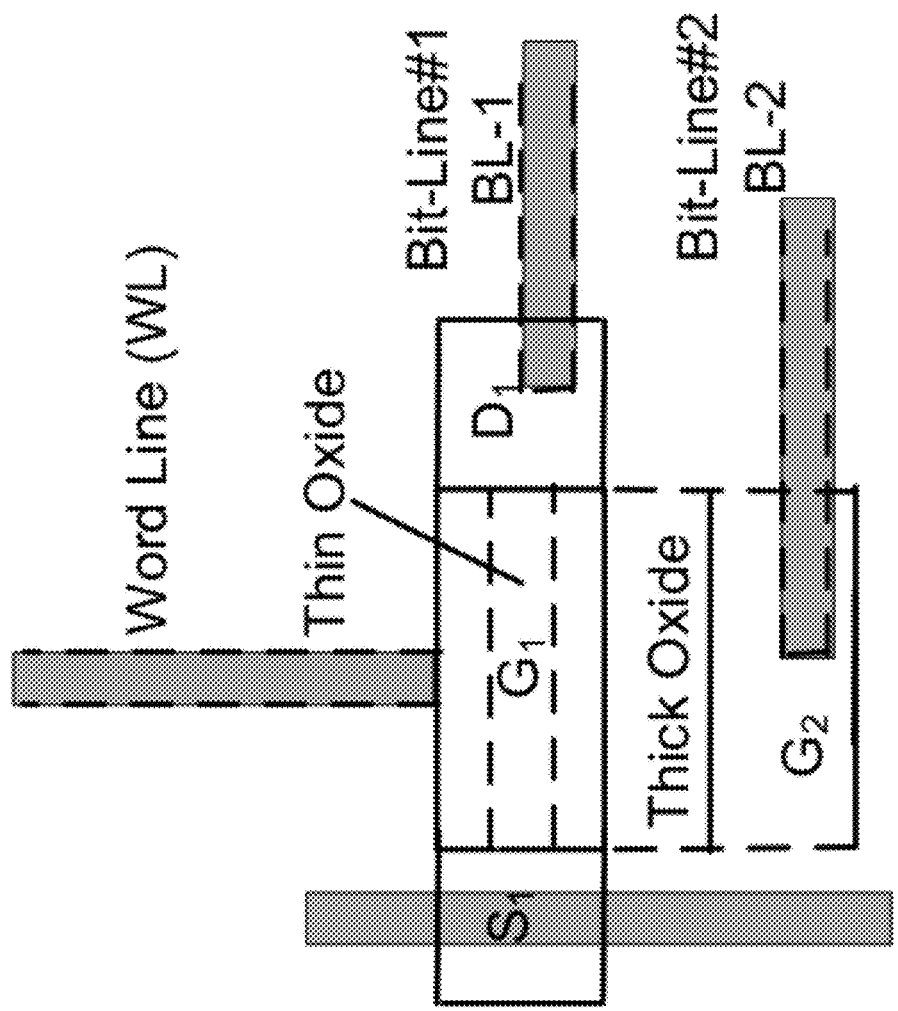
FIG. 14 is schematic block diagram of a memory cell or device addressing scheme when memory is used as a nonvolatile random access memory (with two bit lines).

NVRAM cell: It should be appreciated that the electron charge on the floating quantum dots (i.e. first set of QDs) is stored (Write) or retrieved (Erase) via transport through the QDC channel. Referring to FIG. 14, on embodiment of the electrical interface of the QDG-QDC nonvolatile random access memory cell with word line (WL) and two bit lines (BL-1 and BL-2) is shown. In contrast to the conventional floating gate nonvolatile memory cells, this includes two bit lines. As a result the cell footprint is a little bit larger than the NOR flash cell. In this architecture, the 'Write' and 'Erase operations are accomplished by activating the quantum dot channel (by creating an inversion channel in the second set of dots by applying gate voltage to G1 which is above the threshold ($V_{T,QDC}$) of the QDC-FET). For example, in this embodiment, the QDC layer 76 is located on top of the floating quantum dot layer 73 under gate G1. A charge can be introduced in these floating dots layer 73 (See FIG. 10b and FIG. 10d). Thus, in this embodiment the QDC layer can take out charge from layer 73 (to perform erase operation for writing "0"). In another embodiment, the QDC layer is not used as a FET, but rather as a channel to remove charge or introduce charge in floating gate QDs 73.

Erase: Again referring to FIG. 14, it should be appreciated that one way to accomplish the retrieval of electrons stored on the floating QDG (first set of quantum dot) involves the outflow of electrons from the floating gate through the tunnel insulator (t1) via the source S1. In this case a negative voltage is applied to G2 and positive voltage to S1. Another way to accomplish the retrieval of electrons stored on the floating QDG (first set of quantum dot) involves the outflow of electrons via QDC via gate G2 (and D2). Here, a positive bias is applied at G2 (via D2 n-Si region). It should be appreciated that the Erase time is expected to be ~50 ns and read time of ~10 ns. These times can be reduced by increasing the mobility of the QDC layer.

Write: Again referring to FIG. 14, it should be appreciated that during a 'Write' state, electrons are transferred to the floating quantum dot gate G1 by making BL-2 negative and BL-1 either 0 or >0 (positive). When BL-2 is negative D2 acts as an effective source supplying electrons to the floating gate, using the inversion channel formed in QDC as an interconnect. When the source S1 is made positive, there is some tunneling, and the writing will be somewhat faster. The retention time and writing cycles for QDG-QDC nonvolatile random access memory is estimated to be better than conventional devices.

Also, the device can be used as a functional nonvolatile RAM having a matrix of access FETs. The gate of which is connected to a Word line. In addition, use of SW/QDC FET structure, configured as a NVRAM is envisioned to address processing of multiple bits.

In one embodiment, the quantum dots, forming the floating gate of a nonvolatile memory device, are accessed to remove charge from the floating gate and accomplish a faster erase operation. Such a device is also presented. In another embodiment, stacks of quantum dots are formed to realize high value ultra large capacitors. This utilizes the high dielectric constant of cladded quantum dots such as SiOx-cladded Si quantum dots and GeOx-cladded Ge quantum dots with a higher effective dielectric constant than SiOx or GeOx. In still yet another embodiment, a layer of quantum dots may be used to serve as a mediator layer, reducing dislocations, to achieve growth of mismatched epitaxial layer on a substrate. In still yet another embodiment, an array of cladded (thin layer but high band gap) quantum dots may serve as a quantum dot superlattice (having mini-energy bands that are separated in energy and having certain miniband width), wherein the quantum dot superlattice may function as an n-type semiconductor having an energy band higher than the energy gap of the semiconducting quantum dot. This layer, say of conductivity n may be used to form a p-n diode using another p-type layer. This device may also function as a solar cell.

In another embodiment of the invention, a quantum dot channel (QDC) field-effect transistor device is provided and may include a substrate which hosts a source region, a gate region, and a drain region. A transport channel is located between the source and drain regions and includes an array of cladded quantum dots, where the quantum dots have a thin cladding (about 1-2 nm) layer which may be selected from SiOx, GeOx on semiconductor dots that may be selected from Si and/or Ge. The array of cladded dots include at least one and preferably two or more layers. The array of dots is assembled on a semiconductor substrate of p-type conductivity and is constructed from a material that may be selected from semiconductors that include Si, Ge, InGaAs, GaAs, and/or GaN (or other suitable material). The array of dots may be deposited in a region between the n-type source and drain regions, and the cladding layer of the top cladded dot array is deposited with a thin gate insulator layer. The thin insulator layer is deposited with a gate material selected from a metallic and/or semiconducting material that results in a desired threshold voltage for the field-effect transistor.

Moreover, in another embodiment a field effect transistor configured as a nonvolatile random access memory, is provided and includes a source region, a gate region, and a drain region, wherein the gate region includes a first thin gate insulator layer. The first thin gate insulator layer is deposited with the first set of cladded quantum dots over the transport channel region located between the source and drain. The first set of cladded quantum dot layer is deposited with a second set of cladded quantum dot layer with thin cladding layer, the first set of dots forming the floating gate which stores the charge when the memory is written, the second set of dots may have a thin barrier and having a small core such that it transports charge, the top part of the second set of cladded dot layer is deposited with a second gate insulator serving as control gate insulator over the transport channel region. Additionally, a first gate may be formed over the two sets of quantum dots, wherein the first gate is over the entire transport channel formed between the source and drain region. The second set of quantum dot layer may be contacted by a separate second gate which may be located differently from the first gate, the second gate may be formed in a region where the gate insulator is relatively thicker then the first gate insulator, wherein the second gate may be used to extract electrons deposited on the quantum dot floating gate during erase cycle, and the electrons may be removed by biasing the second gate and the source region appropriately.

It should be appreciated that in one embodiment, the substrate is a thin film that is constructed from a material that may be selected from poly-crystalline, microcrystalline, nanocrystalline, and/or amorphous material, the transistor has a channel which may be comprised of cladded quantum dots, where the cladded dots are self-assembled on the poly-Si, microcrystalline semiconductor, and nanocrystalline semiconductor, and wherein the cladded dots form the transport channel that conducts current when a gate voltage above threshold is applied and drain and source regions are biased.

In still yet another embodiment, a method of fabricating a quantum dot channel FET and nonvolatile random access memory, where the channel region may be created in a Si substrate under the gate region between the source and drain is provided. The channel region may be recessed, where the recessed region is deposited with cladded quantum dot array, and wherein the cladded quantum dots may have another set of dots for realizing nonvolatile memory with a fast erase time. In still yet another embodiment, a FET comprising a transport channel combining quantum dot channel (QDC) and spatially switched wavefunction features is provided. The FET includes a quantum dot array to form a quantum dot channel and is incorporated on top of a coupled quantum well structure between the source and drain regions. The combined FET structure exhibiting characteristics of spatial wavefunction switched transistor and QDC type multi-state behavior, and the transport channel may have more than one drain region.

In still yet another embodiment, a method of depositing low defect density epitaxial layer on a substrate selected from the list of Si, Ge, GaAs is provided where the epitaxial layer may comprise a multiplicity of layers forming a device. The epitaxial layer may be selected from one (or more) of InGaAs, InP, CdTe, HgCdTe, GaAs, (or other suitable material). The substrate and the low defect density epitaxial layer is sandwiching between them, a thin buffer layer and a quantum dot nano structure layer, where the buffer layer may be grown on the substrate and may be very thin ranging from about 1-2 nm to about 10-20 nm, and where the quantum dot layer may have self-organized quantum dots which may be realized using strain mismatch. The self-organized quantum dots creating (or may have) regions between them, where the regions between the quantum dots may be used to nucleate buffer layers that have lattice constant similar to the epitaxial layers. The buffer layers may be heat treated to anneal defects and dislocations and the epitaxial layers may be grown following the annealing of any defects.

In still yet another embodiment, a QDC FET is provided where a quantum dot array is used to form a transport channel which includes three or more quantum dot layers, where the quantum dot layers are electrically connected separately in the drain region to form two or more drains, wherein the transport channel is contacting more than 2 source regions, such that the FET structure exhibits characteristics of spatial wavefunction switched transistor.

In still yet another embodiment, a QDC FET of is provided having a quantum dot channel that is deposited with a second set of quantum dot array forming the quantum dot gate FET with a QDC transport channel. Also included is a device as described hereinabove which may incorporate quantum dot gate region(s) on top of the quantum dot channel implementing a FET which may have multiple states. Moreover, in still yet another embodiment, a p-n junction diode including at least one layer of quantum dot superlattice is provided, wherein the quantum dot superlattice includes two or more layers of cladded quantum dots, wherein the cladding is thin and is comprised of higher energy gap oxide than the gap of the semiconductor dot, and wherein the other layer forming the diode is of opposite conductivity than that of the quantum dot superlattice.

In still yet another embodiment, a p-n junction diode functioning as a solar cell is provided, wherein the diode includes at least one layer of quantum dot superlattice. The quantum dot superlattice includes two or more layers of cladded quantum dots, wherein the cladding is thin and is comprised of a higher energy gap oxide than the gap of the semiconductor dot, and the other layer forming the diode is of opposite conductivity than that of the quantum dot superlattice. In another embodiment, a field-effect transistor device having a transport channel comprising an array of cladded quantum dots is provided wherein the dots are cladded with a thin barrier and have a small core. The quantum dot layer is located between a source region and a drain region, and the top part of the cladded quantum dot layer has a thin insulator layer, where the insulator layer may be deposited with a gate material selected from metals and semiconductors. The charge in the quantum dot channel may be controlled by a gate electrode, where the magnitude of drain to source voltage determines the source-drain current voltage characteristics for a given gate voltage.

Additionally, in another embodiment a field effect transistor configured as a nonvolatile memory is provided where, the device may include a floating gate that may be realized using a first set of cladded quantum dots. The first set of cladded quantum dots may be deposited on a thin gate insulator over the transport channel region located between the source and the drain, wherein the first set of cladded quantum dots may form the floating gate and the device may include a second set of cladded quantum dots. The second set of cladded quantum dots may have a thin barrier and a small core, wherein a first gate may be formed over the two sets of cladded quantum dots. In the first gate region, the two sets of cladded quantum dots may be separated by an insulator serving as the control gate dielectric, where the first gate may be over the entire channel length formed between the source region and the drain region, the second set of cladded quantum dot layer may be contacted by a separate second gate which may be located differently from the first gate, the second gate may be formed in a region where the gate insulator is relatively thicker then the first gate insulator, the second gate may be used to extract electrons deposited on the quantum dot floating gate, and the electrons may be removed by biasing the second gate and the source region appropriately.

In still yet another embodiment, a thin film transistor is provided where the transistor has a channel which may be comprised of cladded quantum dots, where the dots may be assembled on a layer that may be selected from poly-Si, microcrystalline semiconductor, and nanocrystalline semiconductor (or other suitable material). The channel may be located between a source region and a drain region, the quantum dot channel may have an insulator, and the insulator may have a gate.

Furthermore, in still yet another embodiment a method of fabricating a quantum dot channel FET is provided, where the channel region may be created in a Si substrate in the gate region between the source and drain. The channel region may be recessed, where the recessed region may host the cladded quantum dots and the cladded quantum dots may have another set of dots for realizing nonvolatile memory with a fast erase time. Additionally, in another embodiment a method of depositing low defect density epitaxial layer on a substrate selected from the list of Si, Ge, GaAs is provided, where the epitaxial layer may comprise a multiplicity of layers forming a device. It should be appreciated that the epitaxial layer may be selected from InGaAs, InP, CdTe, HgCdTe, GaAs, (or other suitable material), the substrate and the low defect density epitaxial layer sandwiching between them a thin buffer layer and a quantum dot nanostructure layer. The buffer layer may be grown on the substrate and may be very thin ranging from about 1-2 nm to about 10-20 nm, the quantum dot layer may have self-organized quantum dots which may be realized using strain mismatch, the self-organized quantum dots creating (or may have) regions between them, where the regions between the quantum dots may be used to nucleate buffer layers that have lattice constant similar to the epitaxial layers, and the buffer layers may be heat treated to anneal defects and dislocations. Moreover, the epitaxial layers may be grown following the annealing of any defects.

In accordance with the present invention, the processing of the method of the present invention may be implemented, wholly or partially, by a controller operating in response to a machine-readable computer program. In order to perform the prescribed functions and desired processing, as well as the computations therefore (e.g. execution control algorithm(s), the control processes prescribed herein, and the like), the controller may include, but not be limited to, a processor(s), computer(s), memory, storage, register(s), timing, interrupt (s), communication interface(s), and input/output signal interface(s), as well as combination comprising at least one of the foregoing.

Moreover, the method of the present invention may be embodied in the form of a computer or controller implemented processes. The method of the invention may also be embodied in the form of computer program code containing instructions embodied in tangible media, such as floppy diskettes, CD-ROMs, hard drives, and/or any other computer-readable medium, wherein when the computer program code is loaded into and executed by a computer or controller, the computer or controller becomes an apparatus for practicing the invention. The invention can also be embodied in the form of computer program code, for example, whether stored in a storage medium, loaded into and/or executed by a computer or controller, or transmitted over some transmission medium, such as over electrical wiring or cabling, through fiber optics, or via electromagnetic radiation, wherein when the computer program code is loaded into and executed by a computer or a controller, the computer or controller becomes an apparatus for practicing the invention. When implemented on a general-purpose microprocessor the computer program code segments may configure the microprocessor to create specific logic circuits.

It should be appreciated that while the invention has been described with reference to an exemplary embodiment, it will be understood by those skilled in the art that various changes, omissions and/or additions may be made and equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

I claim:

1. A quantum dot channel (QDC) field-effect transistor device, comprising:
   a substrate, wherein the substrate includes
      a source region,
      a gate region,
      a drain region, and
      a transport channel located between the source region and the drain region,
   wherein the transport channel is comprised of an array of cladded quantum dots, the cladded quantum dots being comprised of at least one Si and Ge and having a thin cladding layer comprised of at least one of SiOx and GeOx, and wherein the array of cladded quantum dots include a top layer of cladded quantum dots and a bottom layer of cladded quantum dots, the array of cladded quantum dots being assembled on a semiconductor substrate of p-type conductivity and being constructed from a semiconductor material which includes at least one of Si, Ge, InGaAs, GaAs, GaN,
   wherein the array of cladded quantum dots are deposited in a region between source region and the drain region, and wherein the cladding of the top layer of cladded quantum dots is deposited with a thin gate insulator layer,
   wherein the thin gate insulator layer is deposited with a gate material constructed from at least one of a metallic material and a semiconducting material which results in a pre-determined threshold voltage for the field-effect transistor.

2. A field effect transistor, configured as a nonvolatile random access memory, the field effect transistor comprising:
   a source region,
   a gate region,
   a drain region, and
   a transport channel region located between the source region and the drain region,
      wherein the gate region includes a first thin gate insulator layer deposited with a first set of cladded quantum dots over the transport channel region, and
      wherein the first set of cladded quantum dots is deposited with a second set of cladded quantum dots having a thin cladding layer, the first set of cladded quantum dots forming a floating gate which stores a charge when a memory is written, and
      wherein the second set of cladded quantum dots include a thin barrier and a small core to transport charge, wherein a top part of the second set of cladded quantum dots is deposited with a second gate insulator over the transport channel region,
      wherein a first gate is formed over the first set of cladded quantum dots and the second set of cladded quantum dots,
         wherein the first gate is disposed over the transport channel region, and wherein the second set of cladded quantum dots are contacted by a second gate which is located differently from the first gate, wherein the second gate is formed in a region where the gate insulator is relatively thicker then the first gate insulator, and
   wherein the second gate is used to extract electrons deposited on the quantum dot floating gate during an erase cycle, wherein the electrons may be removed by biasing the second gate and the source region.

3. The field effect transistor of claim 2, where the transport channel is comprised of array of cladded quantum dots, comprising at least one layer of cladded quantum dots.

4. A quantum dot channel (QDC) field-effect transistor device, comprising:
   a source region,
   a gate region,
   a drain region, and
   a transport channel region, wherein the transport channel region is located between the source region and the drain region,
   wherein the transport channel region includes an array of cladded quantum dots, the cladded quantum dots being comprised of at least one Si and Ge and having a thin cladding layer comprised of at least one of SiOx and GeOx, and wherein the array of cladded quantum dots include a cladded quantum dot top layer and a cladded quantum dot bottom layer, the array of cladded quantum dots being assembled on a semiconductor substrate and being at least partially constructed from a semiconductor material which includes at least one of Si, Ge, InGaAs, GaAs, GaN, amorphous Si-on-glass, amorphous SiGe-on-glass, amorphous-Ge-on-glass, amorphous-InGaZnO-on-glass, amorphous-Si-on-sapphire, wherein the array of cladded quantum dots are deposited between the source region and the drain region, and wherein the cladded quantum dot top layer includes a cladding deposited with a thin gate insulator layer, and wherein the thin gate insulator layer is deposited with a gate material constructed from at least one of a metallic material and a semiconducting material which results in a pre-determined threshold voltage for the field-effect transistor.

5. The quantum dot channel (QDC) field-effect transistor device of claim 4, wherein the semiconductor substrate is at least one of a p-type substrate and an n-type substrate.

6. A field effect transistor, wherein the field effect transistor is configured as a nonvolatile random access memory, the field effect transistor comprising:
 a substrate having a,
  a source region,
  a gate region,
  a first drain region, and
  a transport channel region, wherein the transport channel region is located between the source region and the first drain region, wherein the gate region includes a first thin gate insulator layer deposited with a first set of cladded quantum dots, and wherein the first set of cladded quantum dots is deposited with a second set of cladded quantum dots having a cladding layer, the first set of cladded quantum dots forming a floating gate configured to store a charge, and wherein the second set of cladded quantum dots include a top portion deposited with a second gate insulator over the transport channel region an including an overlap outside the transport channel region, wherein the gate region is formed over the second gate insulator and disposed over the transport channel region, and wherein the second set of cladded quantum dots are contacted by a second drain region which is located differently from the first drain region, wherein the second drain region is formed in a region where the second gate insulator has a different thickness then the first gate insulator, and wherein the second drain region is configured to extract electrons deposited on the floating gate by biasing the second drain region and the source region.

* * * * *